US012532786B2

(12) United States Patent
Shibuya et al.

(10) Patent No.: US 12,532,786 B2
(45) Date of Patent: Jan. 20, 2026

(54) SEMICONDUCTOR DEVICE PACKAGE WITH VERTICALLY STACKED PASSIVE COMPONENT

(71) Applicant: TEXAS INSTRUMENTS INCORPORATED, Dallas, TX (US)

(72) Inventors: Makoto Shibuya, Tokyo (JP); Kwang-Soo Kim, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 428 days.

(21) Appl. No.: 18/160,818

(22) Filed: Jan. 27, 2023

(65) Prior Publication Data

US 2024/0258288 A1 Aug. 1, 2024

(51) Int. Cl.
*H01L 25/16* (2023.01)
*H01L 21/48* (2006.01)
(Continued)

(52) U.S. Cl.
CPC ........ *H01L 25/165* (2013.01); *H01L 21/4825* (2013.01); *H01L 21/565* (2013.01); *H01L 23/3107* (2013.01); *H01L 23/4952* (2013.01); *H01L 23/49555* (2013.01); *H01L 23/49575* (2013.01); *H01L 23/49582* (2013.01); *H01L 24/45* (2013.01); *H01L 24/48* (2013.01); *H01L 24/16* (2013.01); *H01L 24/32* (2013.01); *H01L 24/73* (2013.01); *H01L 2224/16245* (2013.01); *H01L 2224/32245* (2013.01);
(Continued)

(58) Field of Classification Search
CPC . H01L 25/165; H01L 21/4825; H01L 21/565; H01L 23/3107; H01L 23/4952; H01L 23/49555; H01L 23/49575; H01L 23/49582; H01L 24/45; H01L 24/48
See application file for complete search history.

(56) References Cited

U.S. PATENT DOCUMENTS

2019/0157188 A1* 5/2019 Mullenix .......... H01L 23/49537

OTHER PUBLICATIONS

"SMIC Lead-free Flux Cored Solder Product Catalogue", p. 15, Catalog, 2020, Senji Metal Industry Co.,Ltd., Tokyo, Japan, retrieved from the uniform resource locator (URL): https://www.senju.com/en/download/pdf/SMIC_20_cat_YANI_E_0407.pdf on Jan. 6, 2023.

* cited by examiner

Primary Examiner — Walter H Swanson
(74) Attorney, Agent, or Firm — Ronald O. Neerings; Frank D. Cimino

(57) ABSTRACT

In a described example, an apparatus includes: a package substrate with conductive leads; a semiconductor die mounted to the package substrate, the semiconductor die having a first thickness; electrical connections coupling bond pads on the semiconductor die to conductive leads on the package substrate; brackets attached to the package substrate spaced from the semiconductor die and extending away from the package substrate to a distance from the package substrate that is greater than the first thickness of the semiconductor die; and mold compound covering the package substrate, the semiconductor die, the brackets, and the semiconductor die to form a semiconductor device package having a board side surface and a top surface opposite the board side surface, and having portions of the brackets exposed from the mold compound on the top surface of the semiconductor device package to form mounts for a passive component.

17 Claims, 20 Drawing Sheets

(51) Int. Cl.
*H01L 21/56* (2006.01)
*H01L 23/00* (2006.01)
*H01L 23/31* (2006.01)
*H01L 23/495* (2006.01)

(52) U.S. Cl.
CPC .............. *H01L 2224/45541* (2013.01); *H01L 2224/45624* (2013.01); *H01L 2224/45647* (2013.01); *H01L 2224/48245* (2013.01); *H01L 2224/48465* (2013.01); *H01L 2224/73265* (2013.01); *H01L 2924/19041* (2013.01); *H01L 2924/19042* (2013.01); *H01L 2924/19043* (2013.01); *H01L 2924/19104* (2013.01)

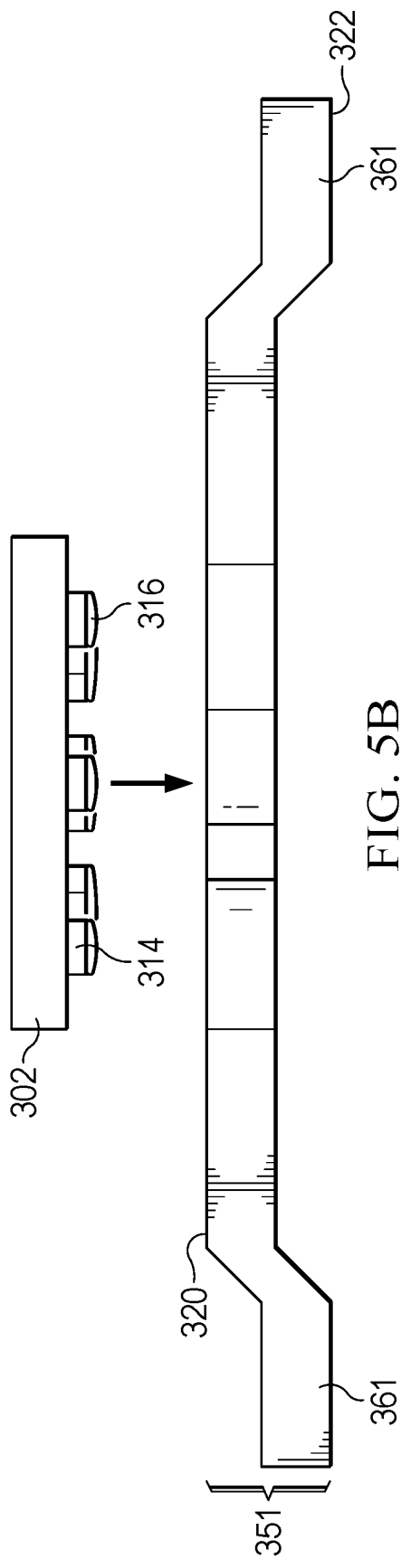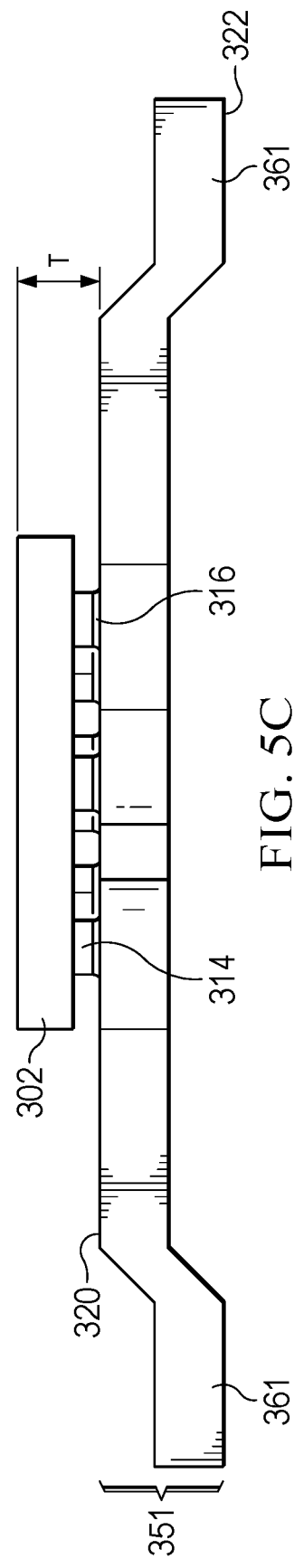

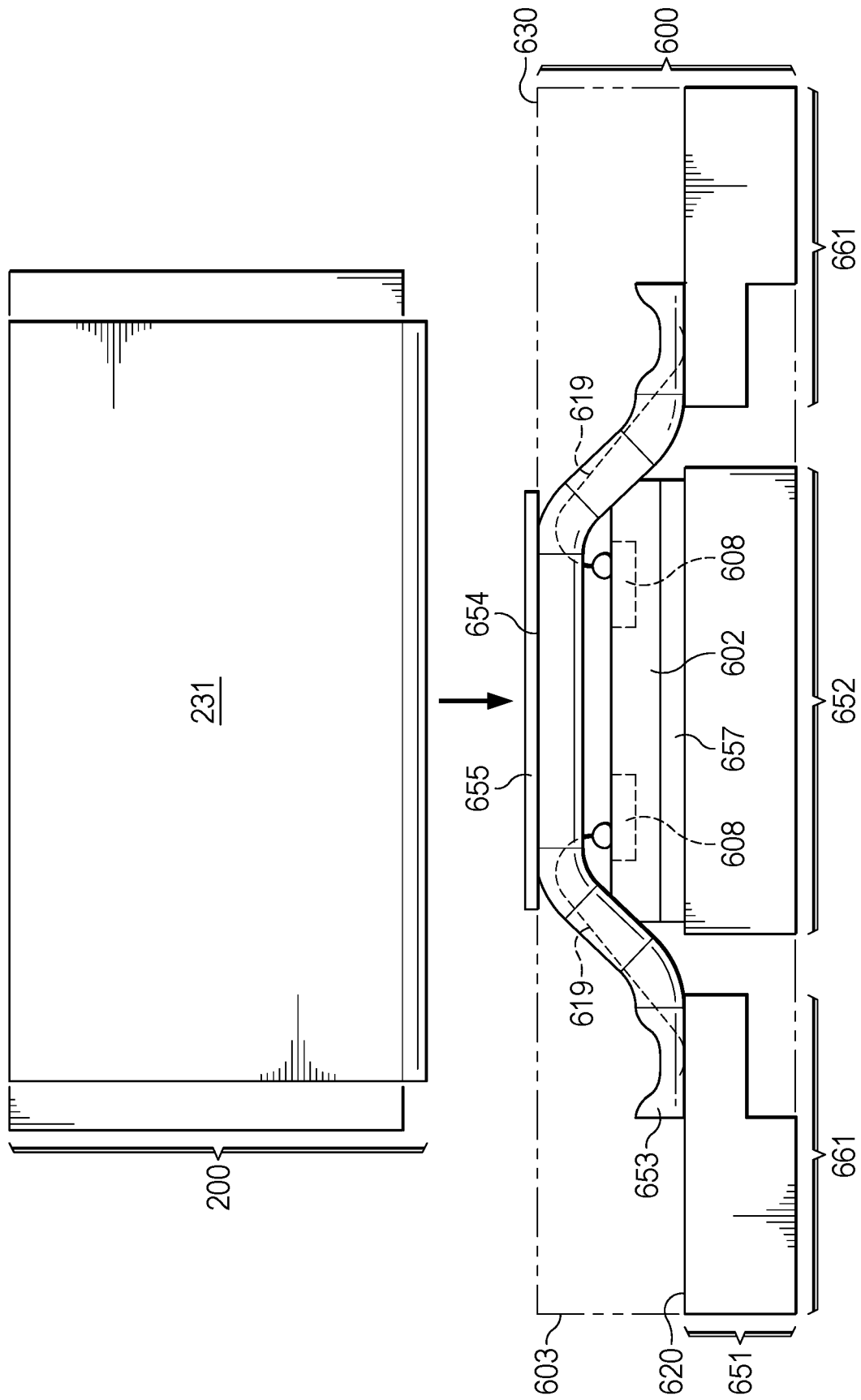

SEMICONDUCTOR DEVICE PACKAGE WITH VERTICALLY STACKED PASSIVE COMPONENT

TECHNICAL FIELD

This disclosure relates generally to semiconductor device packages, and more particularly to semiconductor device packages including a semiconductor die mounted with a vertically stacked passive component. Example components include inductors, transformers, coils, capacitors, resistors and sensors.

BACKGROUND

To reduce the board area required for devices, integrated circuits and related components can be packaged as modules. Example systems that are integrated together include power field effect transistors (FETs) coupled in switching power circuits. In an example switching power circuit, passive components including inductors, resistors and capacitors are coupled between a switching node and an output used for powering a load. It is desirable to provide the passive components and the integrated circuit in a single device package to reduce board area and to simplify system connections needed to use the switching power circuits in a system. However, these packages can either require additional board area, such as when the passive components and integrated circuits are placed side by side on a package substrate that is then packaged as a combined module, or have substantial costs to manufacture. Examples include specially packaged passive components that have a slot or space specially fabricated for mounting a semiconductor die within the component package, and the use of custom added assembly parts such as copper clips or copper posts that are added to a package substrate during semiconductor device package manufacture to allow a passive component to be vertically mounted on the package substrate.

A continuing need exists for semiconductor device packages that include passive components with low system board area, having low costs of manufacture and having high reliability.

SUMMARY

In a described example, an apparatus includes: a package substrate with conductive leads; a semiconductor die mounted to the package substrate, the semiconductor die having a first thickness; electrical connections coupling bond pads on the semiconductor die to conductive leads on the package substrate; brackets attached to the package substrate spaced from the semiconductor die and extending away from the package substrate to a distance from the package substrate that is greater than the first thickness of the semiconductor die; mold compound covering the package substrate, the semiconductor die, the brackets, and the semiconductor die to form a semiconductor device package having a board side surface and a top surface opposite the board side surface, with portions of the conductive leads exposed from the mold compound to form terminals on the board side surface of the semiconductor device package, and with portions of the brackets exposed from the mold compound on a top surface of the semiconductor device package to form mounts for a passive component.

In another described example, a method includes: mounting a semiconductor die having a first thickness to a device side surface of a package substrate, the package substrate comprising metal leads configured for carrying signals or voltages, the package substrate having a board side surface opposite the device side surface; forming electrical connections from bond pads on the semiconductor die to the metal leads of the package substrate; mounting brackets to the device side surface of the package substrate, the brackets extending away from the package substrate to a distance that is greater than the first thickness; and covering the semiconductor die, the electrical connections, the board side surface of the package substrate, and the brackets with mold compound to form a semiconductor device package, with portions of the brackets exposed from the mold compound at a top surface of the semiconductor device package opposite a bottom surface to form mounts for a passive component on the top surface.

BRIEF DESCRIPTION OF THE DRAWINGS

FIGS. 5A-5G illustrate, in a series of end views, selected steps for forming an arrangement.

FIGS. 6A-6F illustrate, in another series of end views, selected steps for forming an alternate arrangement.

DETAILED DESCRIPTION

Figure 1A:
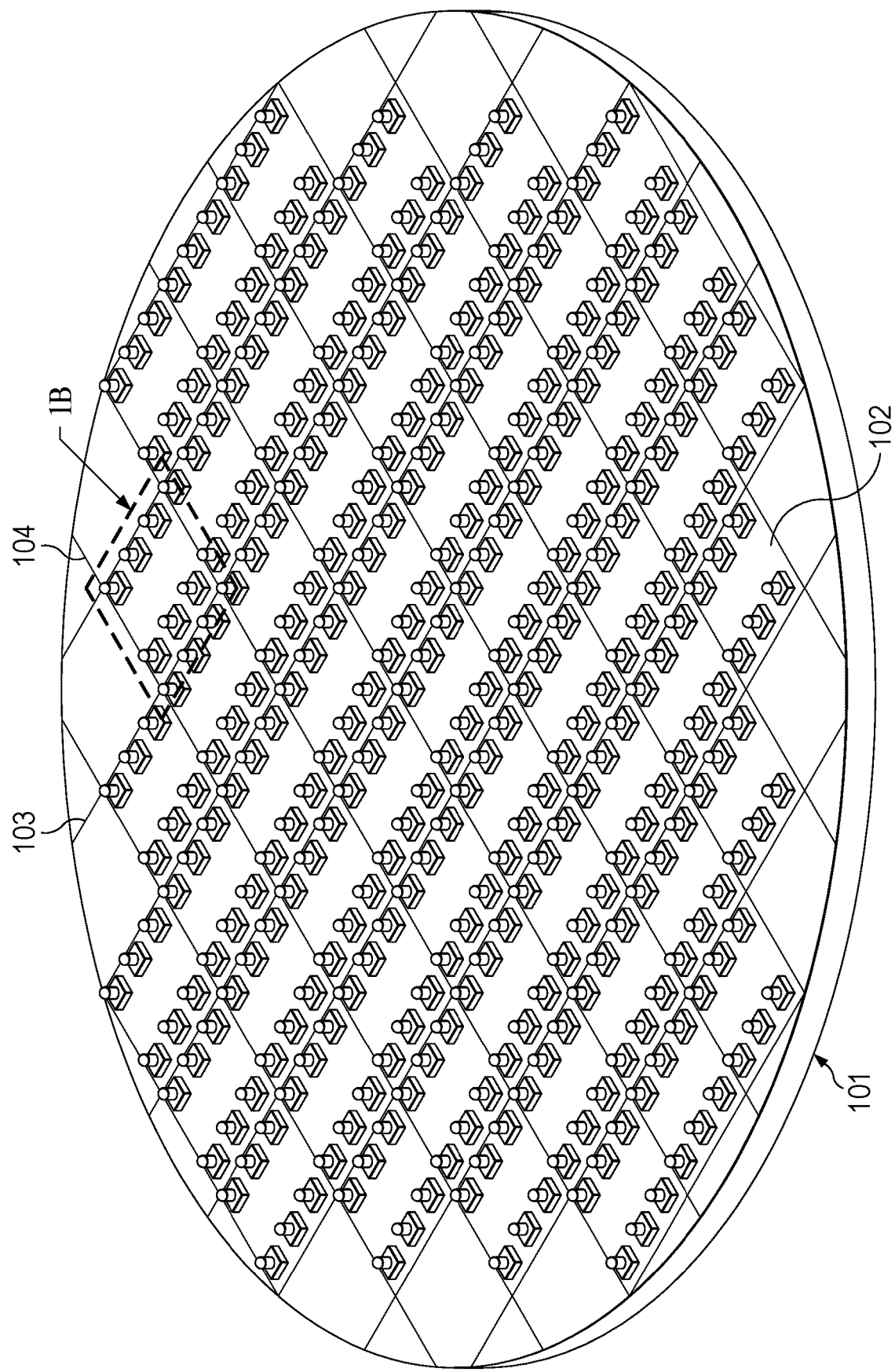
FIGS. 1A-1B illustrate, in a projection view and a close up projection view, respectively, semiconductor dies on a semiconductor wafer, and an individual semiconductor die from the semiconductor wafer for use with the arrangements.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements, conductors, or wires are coupled. In an example arrangement, a sensor receives a magnetic field from a conductor carrying current and is coupled to the conductor, even though the sensor is isolated from the conductor, and no current flows between the sensor and the conductor.

The term "semiconductor die" is used herein. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device. In an example arrangement, the semiconductor die can include a power field effect transistor (FET) or a pair of power FETs.

The term "semiconductor device package" is used herein. A semiconductor device package has at least one semiconductor die electrically coupled to terminals, and has a package body that protects and covers the semiconductor die. The semiconductor device package can include additional elements. Passive components such as sensors, antennas, capacitors, coils, inductors, and resistors can be included. In some arrangements, multiple semiconductor dies can be packaged together. For example, a semiconductor die implementing a high side transistor and a low side transistor for a switching power circuit may be integrated with current and voltage sensors for regulation, gate driver circuits, and a control circuit for frequency modulation or pulse width modulation, may be provided as a single semiconductor die, or as multiple semiconductor dies. In a typical application example, an inductor may be coupled between a switching node of the power converter circuit and an output for supplying current to a load and for sinking current to regulate an output. In an example application, the inductor may be a packaged passive component mounted to a semiconductor device package housing the semiconductor die, and with the passive component coupled to the semiconductor die.

The semiconductor die is/are mounted to a package substrate that provides conductive leads. A portion of the conductive leads form external terminals for the semiconductor device package. In a flip chip semiconductor device package used in an example arrangement, a semiconductor die is mounted with a device side surface including bond pads facing the package substrate. Conductive post connects extending away from the bond pads are mounted to conductive leads of the package substrate using solder. In an example, the conductive post connects can be formed of copper, and may be referred to as copper pillars, pillar bumps, or copper pillar bumps. The conductive post connects have solder bumps formed at the ends for solder mounting to the conductive leads in the package substrate. The conductive post connects carrying solder can be referred to as solder bumps.

In wire bonded semiconductor device packages used in the arrangements as an alternative, bond wires or ribbon bonds couple conductive leads of a package substrate to bond pads on the semiconductor die/dies.

The semiconductor device packages can have a package body formed by a thermoset epoxy resin in a molding process, or by the use of epoxy, plastics, or resin. Thermoset mold compounds can be used that are solid at room temperature, or resins may be used that are liquid at room temperature and are subsequently cured. The package body may provide a hermetic package for the packaged device. The package body may be formed in a mold using an encapsulation process, however, a portion of the leads of the package substrate may not be not covered during encapsulation, these exposed lead portions provide the external terminals for the semiconductor device package.

In packaging semiconductor devices, mold compound may be used to partially cover a package substrate, to cover components, to cover a semiconductor die or multiple semiconductor dies, and to cover the electrical connections from the semiconductor die or dies to the package substrate. This molding process can be referred to as an "encapsulation" process, although some portions of the package substrates are not covered during encapsulation. For example, in the arrangements portions of the leads are left exposed from the mold compound. Encapsulation is often a compressive molding process, where thermoset mold compound such as resin epoxy can be used. Mold compound used in electronic packaging is sometimes referred to as "EMC" or "epoxy mold compound." A room temperature solid or powder mold compound can be heated to a liquid state, and then transfer molding can be performed by pressing the liquid mold compound into a mold through runners or channels. Unit molds shaped to surround an individual device may be used, or block molding may be used. The molding process forms multiple packages simultaneously for several devices. The devices to be molded can be provided in an array or matrix of several, hundreds or even thousands of devices in rows and columns on a leadframe strip. The semiconductor devices that are then molded at the same time to increase throughput.

After molding, the individual packaged semiconductor devices are cut from one another in a sawing operation by cutting through the mold compound and package substrate in saw streets defined between the molded semiconductor devices. In the arrangements, leaded semiconductor device packages used, with a portion of the leads extending outside of the package body formed by the mold compound to form external terminals for solder mounting. The leads can be formed to have feet or bottom surfaces arranged for a solder surface mount operation, such as a solder reflow operation, to form physical connection and electrical coupling of the packaged device to a printed circuit board or module.

The term "package substrate" is used herein. A package substrate is a substrate arranged to receive a semiconductor die and to support the semiconductor die in a completed semiconductor device package. Package substrates can include conductive leadframes, which can be formed from copper, aluminum, stainless steel, steel and alloys such as Alloy 42 and copper alloys. Conductive leads are configured for coupling to bond pads on the semiconductor die. In an example arrangement, the electrical connections from the bond pads to the leads are formed using wire bonds, ribbon bonds, or other conductors. The leadframes can be provided in strips, grids or arrays. The conductive leadframes can be provided as a panel or grid with strips or arrays of unit leadframe portions in rows and columns. Semiconductor dies can be placed on respective unit device leadframe portions within the strips or arrays. In some arrangements, a chip on lead (COL) leadframe can be used with leads arranged for mounting a semiconductor die using conductive post connects in a flip chip mount.

The term "scribe lane" is used herein. A scribe lane is a portion of semiconductor wafer between semiconductor dies. Sometimes the term "scribe street" is used. Once semiconductor processing is completed and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area defined between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

The term "bracket" is used herein. A bracket is a support arranged to support a vertical load. In the arrangements, aluminum or copper brackets are formed in a wedge bonding process using wire and mounted on a package substrate, the wire extending to a horizontal portion of the bracket at a top portion spaced from the package substrate. The aluminum or copper brackets are covered by mold compound in a molding process, however, a portion of a top surface of the brackets remains exposed from the mold compound to form a mount. By using two or more brackets in the arrangements, the mounts can be used to attach a passive component to the top surface of a semiconductor device package. The brackets provide electrical connections between the package substrate and terminals of the passive component as well as providing mechanical support.

In the arrangements, a semiconductor device package includes a semiconductor die mounted to a package substrate, such as a metal leadframe. Electrical connections are made between bond pads on the semiconductor die and conductive leads of the package substrate. The semiconductor die has a thickness, An aluminum or copper bracket is mounted to the package substrate and coupled to conductive leads on the package substrate. The bracket can be formed of an aluminum or copper wire that is coupled to conductive leads of the package substrate using a wedge bonding tool. The wedge bonded wire extends away from the package substrate to a distance that is greater than the thickness of the semiconductor die. Mold compound is formed over the semiconductor die, the package substrate, and the brackets, with a portion of the brackets exposed from a top surface of the semiconductor device package formed by the mold compound. The exposed portions of the bracket form a mount for a passive component. In an example arrangement, two brackets are used and form two mounts on the top surface of the semiconductor device package. In alternative arrangements, additional brackets can be used to form additional mounts. A passive component or more than one passive component can be then mounted to the mounts using solder to form an integrated system.

By use of the arrangements, the semiconductor die and the passive component are vertically stacked, so that the module or board area needed to form a circuit including the semiconductor die and the passive component is reduced (when compared to side by side mounted module devices, or to individual components mounted on a system board), and integration is increased. Additional passive components may be mounted on additional brackets to further increase integration and reduce board area. In forming the arrangements, the brackets are formed using aluminum or copper wire and are attached to the package substrate by wedge bonding at room temperature. The use of a room temperature process has an advantage in wedge bonding the brackets on the package substrate does not require additional high temperature processes that are used in prior approaches with packages formed with copper clips, posts or rails. The use of aluminum or copper wire and well established wedge bonding tools are low in cost, are reliable and are well known processes. In an example where aluminum bond wire is used to from the brackets, a zinc and tin solder specifically arranged to solder the passive components to the aluminum brackets is used in the arrangements to increase performance and reliability. When copper is used to form the brackets, solder typically used for circuit board assembly with copper traces can be used. The materials used in the arrangements and the processing steps used do not require substantial modifications to existing packaging processes, resulting in increased reliability at low costs. The wedge bonding steps and wedge bonding tools used in the arrangements are readily available.

Figure 1B:
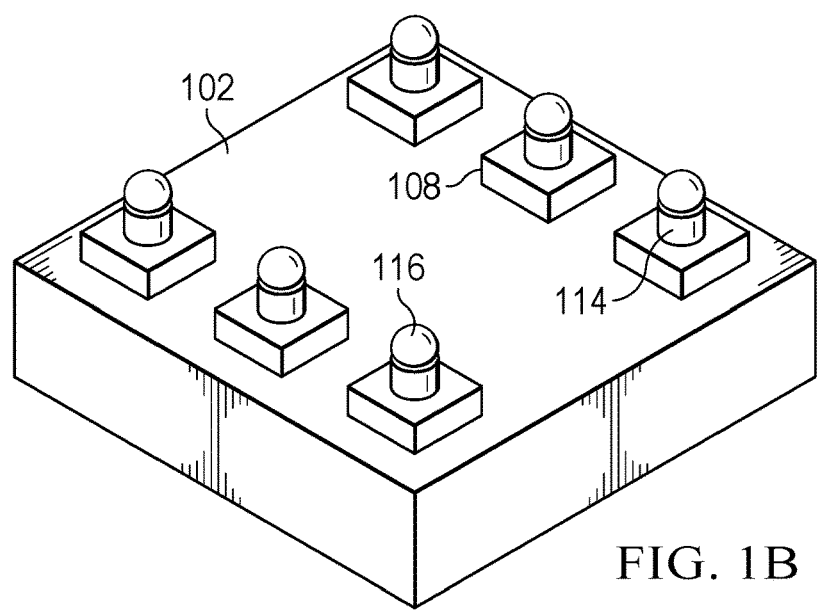

FIGS. 1A and 1B illustrate in projection views a semiconductor wafer 101 having semiconductor devices formed on it (FIG. 1A), and an individual semiconductor die 102 from the wafer for flip chip and face down mounting (FIG. 1B), respectively.

In FIG. 1A, a semiconductor wafer 101 is shown with an array of semiconductor dies 102 formed in rows and columns on a device side surface. The semiconductor dies 102 can be formed using processes used in a semiconductor manufacturing facility, including ion implantation, substrate doping, thermal anneals, oxidation, dielectric and metal deposition, sputter, photolithography, pattern, etch, strip, chemical mechanical polishing (CMP), electroplating, and other processes for making semiconductor devices on wafers. Scribe lanes 103 and 104, which are perpendicular to one another and which run in parallel groups across the wafer 101, separate the rows and columns of the semiconductor dies 102, and provide areas for dicing the semiconductor wafer 101 so as to separate the semiconductor dies 102 from one another.

FIG. 1B illustrates an individual semiconductor die 102, with bond pads 108, which are conductive pads that are electrically coupled to devices (not shown) formed in the semiconductor die 102. The bond pads 108 have conductive post connects 114 formed on and extending away from the semiconductor die 102 to a solder bump 116, to form a vertical connection for soldering to a conductive lead on a package substrate. In an example process, the conductive post connects 114 can be of plated copper, the solder 116 can be formed in a solder bumping process, and the completed structures may be described as copper pillar bumps or simply as solder bumps. Other conductors can be used to form the conductive post connects 114. After the semiconductor dies 102 are completed, the semiconductor dies 102 are then separated by dicing, or are singulated, using the scribe lanes 103, 104 (see FIG. 1A). Mechanical cutting or laser dicing, or a combination, can be used.

Figure 2:
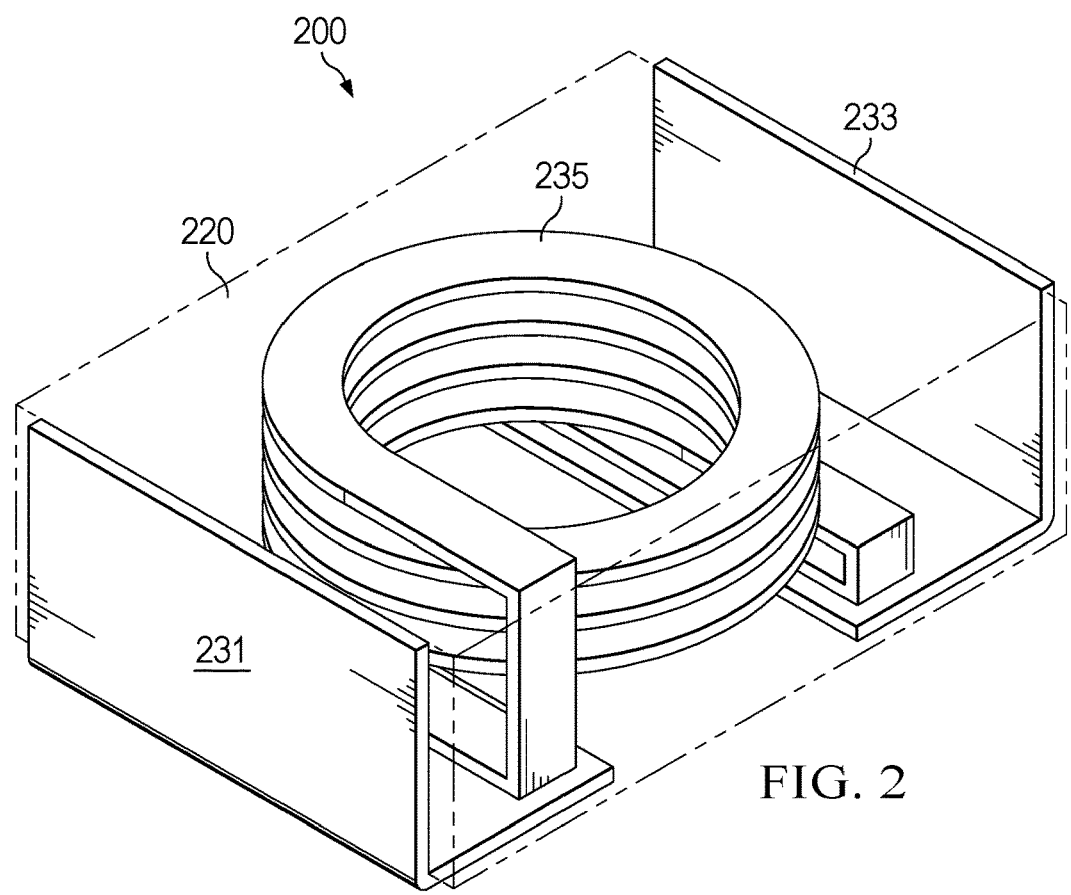
FIG. 2 illustrates, in a projection view, a packaged passive component that is useful with the arrangements.

FIG. 2 illustrates, in a projection view, an example two terminal passive component 200 that can be used with the arrangements. The passive component 200 has terminals 231 and 233 that are arranged for solder mounting. An insulating dielectric package or protective housing 220 protects the passive component 200. The passive component 200 in FIG. 2 contains an inductor or coil 235. However, in other examples, the passive component 200 can be a capacitor, a transformer, a diode, a resistor, a varactor, a thermistor, a transducer, or a sensor.

FIGS. 3A-3D illustrate, in projection views, various details of a packaged semiconductor device and an integrated system of example arrangements.

Figure 3A:
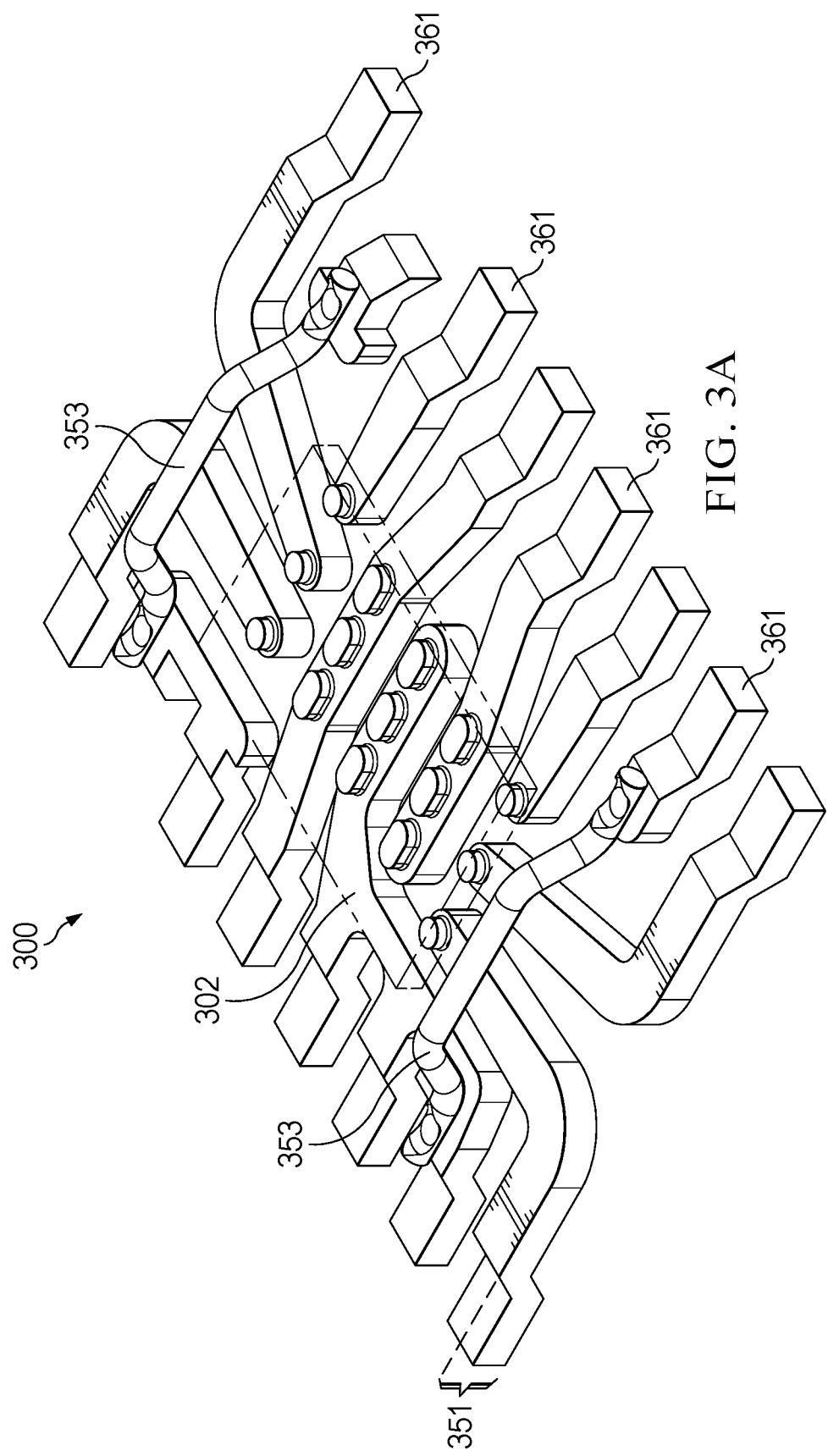
FIGS. 3A-3D illustrate, in projection views, various details of an semiconductor device package of an example arrangement.

In FIG. 3A, a package substrate 351, which in this example is a leadframe arranged for a flip chip mounted chip on lead (COL) package, is shown with leads 361. In a particular example the leadframe 351 can be a copper or plated copper leadframe. Leads 361 can be plated with tin for surface mounting using solder, for example. Semiconductor die 302, which is similar to semiconductor die 102, is shown flip chip mounted in a chip on lead mount. The semiconductor die 302 is mounted with a device side surface facing the conductive leads 361 of the package substrate 351. Brackets 353 are mounted on the package substrate 351 and are bonded to conductive leads. In an example arrangement, the brackets 353 are aluminum wire of a diameter between 100 microns and 500 microns, and are coupled to the conductive leads 361 using aluminum wedge bonding, The aluminum wires are shaped to form aluminum brackets that extend away from the package substrate 351 to a horizontal top portion. In an alternative arrangement, copper wire of a similar gauge can be used with copper wedge bonding. The copper wire can have a diameter of between 100 microns and 500 microns. Aluminum wire is somewhat preferred in the arrangements due to lower cost and versatility.

Figure 3B:
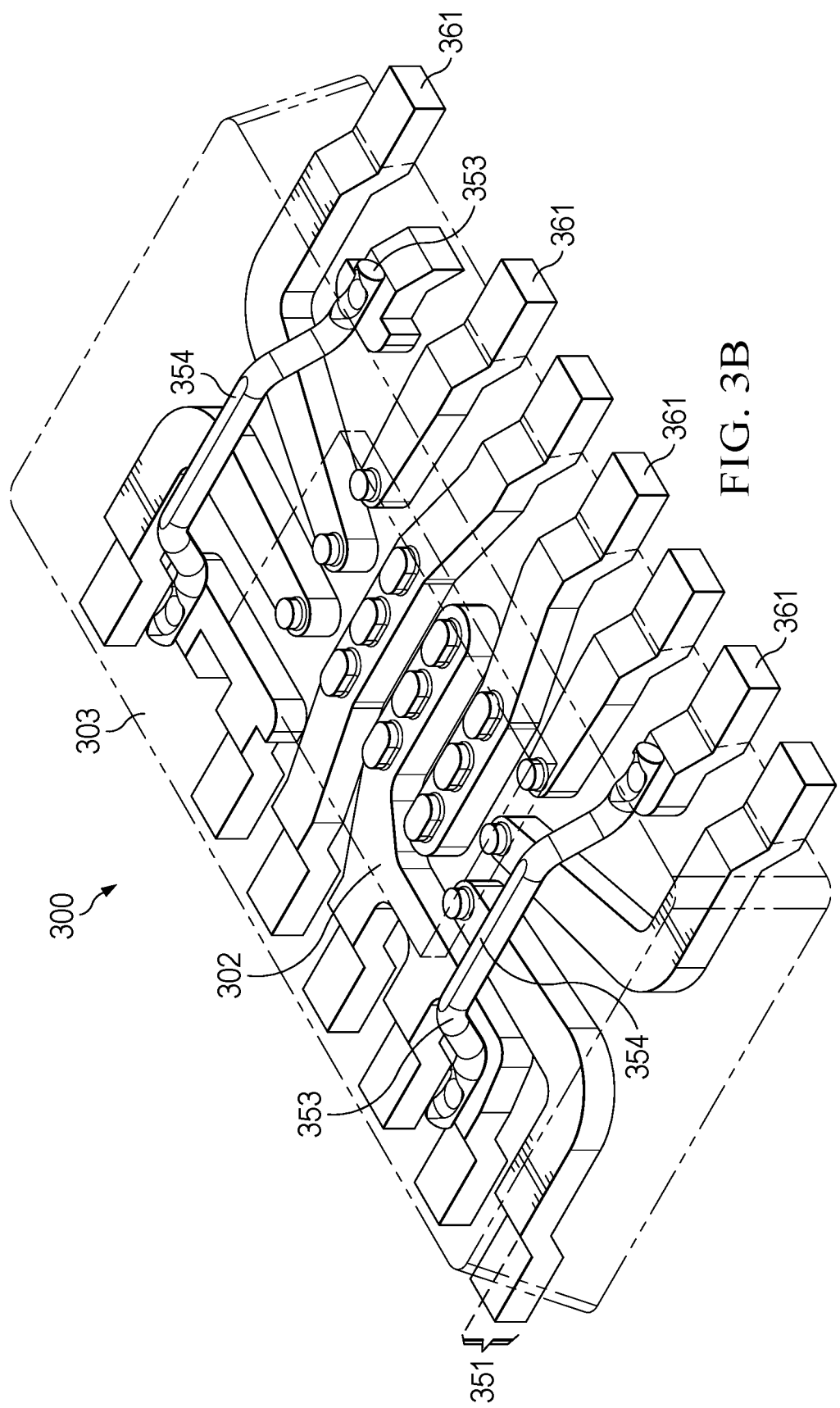

FIG. 3B illustrates the package substrate 351, and semiconductor die 302 shown in FIG. 3A after additional processing. Mold compound 303 is shown covering the semiconductor die, a portion of the package substrate 351, and portions of the brackets 353. The top surfaces of the brackets 353 are partially exposed from the mold compound 303 to form mounts 354. The mounts 354 are arranged for coupling to a passive component to be vertically stacked on the semiconductor device package. Mold compound 303 can be an epoxy mold compound (EMC) and the package body can be formed in an encapsulation molding process. Other resins, epoxies or plastics can be used in alternative arrangements. The semiconductor device package 300 as shown in FIG. 3B can be delivered to a customer for further assembly, alternatively, a passive component can be mounted to the semiconductor device package 300 and the combined devices can be delivered as a single unit as is described below.

Figure 3C:
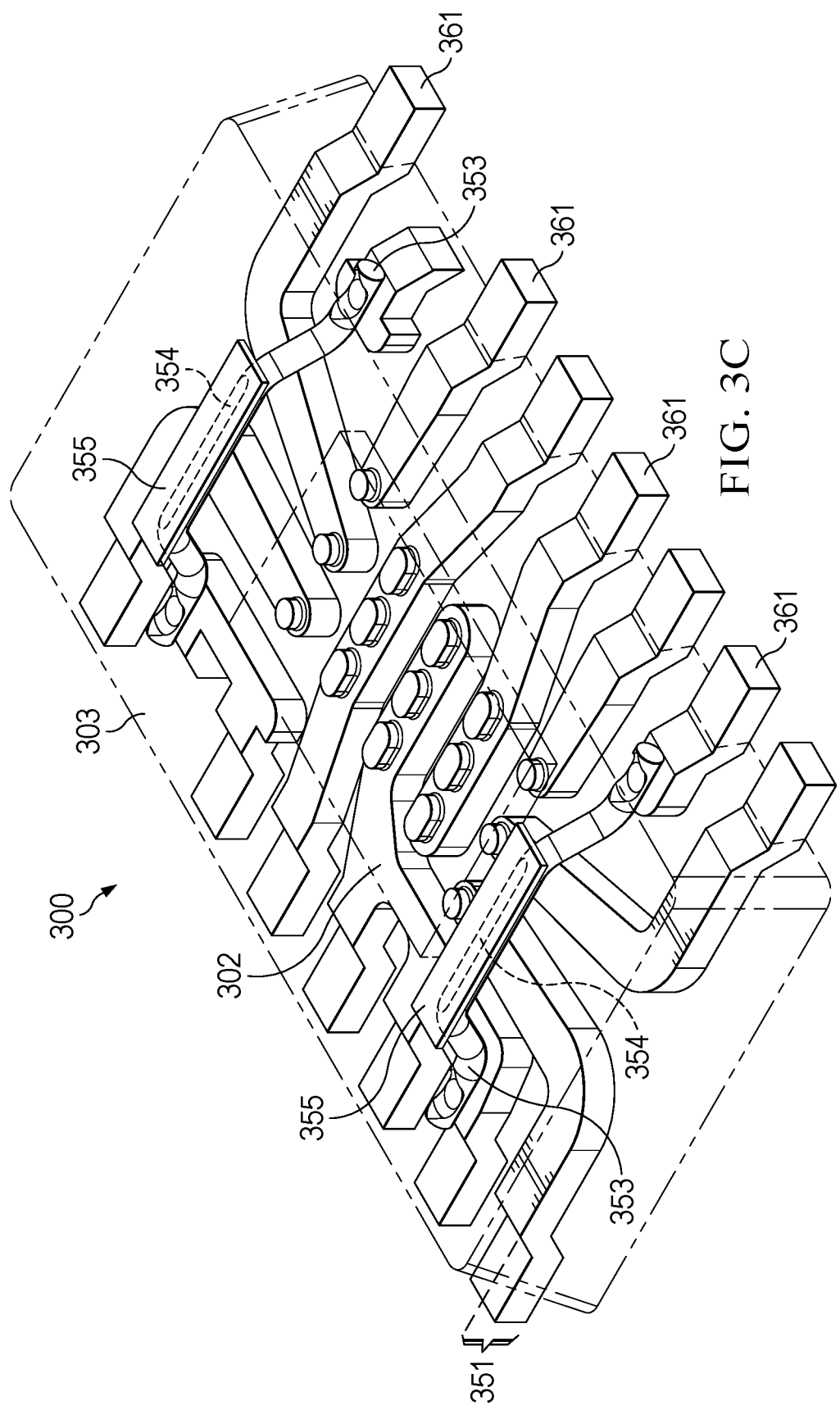

FIG. 3C illustrates the semiconductor device package 300 of FIG. 3B with package substrate 351 and the semiconductor die 302 with mold compound 303 after a solder 355 is applied to the mounts 354. Solder 355 is applied to the mounts 354 in preparation for mounting a passive component to the top surface of a semiconductor device package 300. In a particular example process, when the brackets are of aluminum wire, a zinc and tin composition solder particularly arranged for use with aluminum wire is used. A solder particularly formulated for aluminum wire is commercially available from Senju Metal Industry Co., Limited, ("SMIC") of Tokyo, Japan, and labeled "AL200" or "ALS Series Lead Free Cored Solder." Other solders suitable for soldering to aluminum wire can be used. Lead free solder containing zinc along with tin is useful with the arrangements. In an alternative arrangement where copper wire is used for the brackets 353, the solder can be of any type normally used with copper.

Figure 3D:
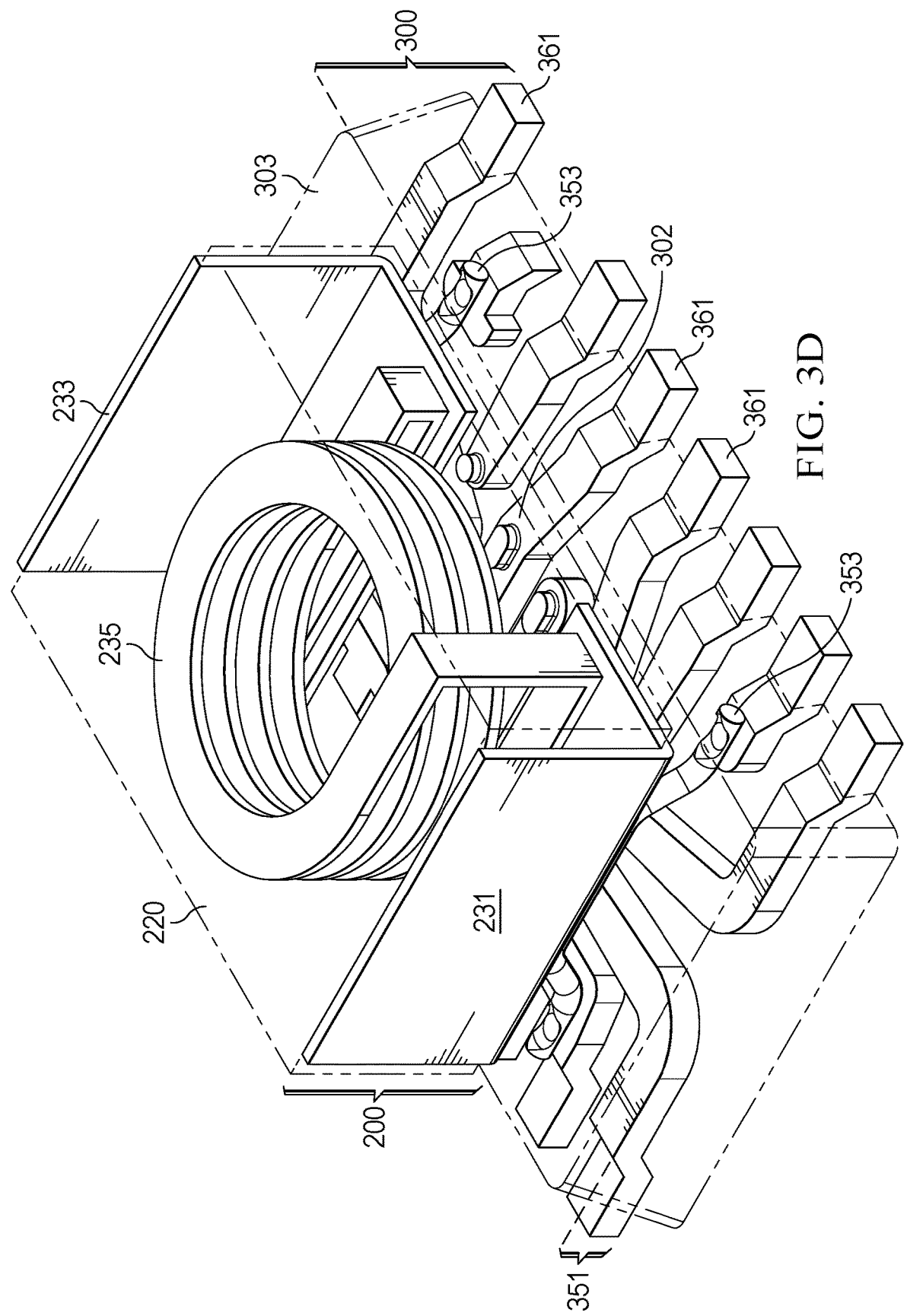

FIG. 3D illustrates the semiconductor device package 300 with passive component 200 mounted on a top surface of the semiconductor device package 300. The solder 355 is used to solder the terminals 231 and 233 of the passive component 200 to the mounts 354 of the brackets 353. The passive component 200 is electrically coupled to the brackets 353, to the package substrate 351, and can be coupled to the semiconductor die (see semiconductor die 302 in FIG. 3A) within the semiconductor device package 300, using the conductive leads 361 of the package substrate 351. The passive component 200 includes inductor 235 in housing 220.

Figure 4:
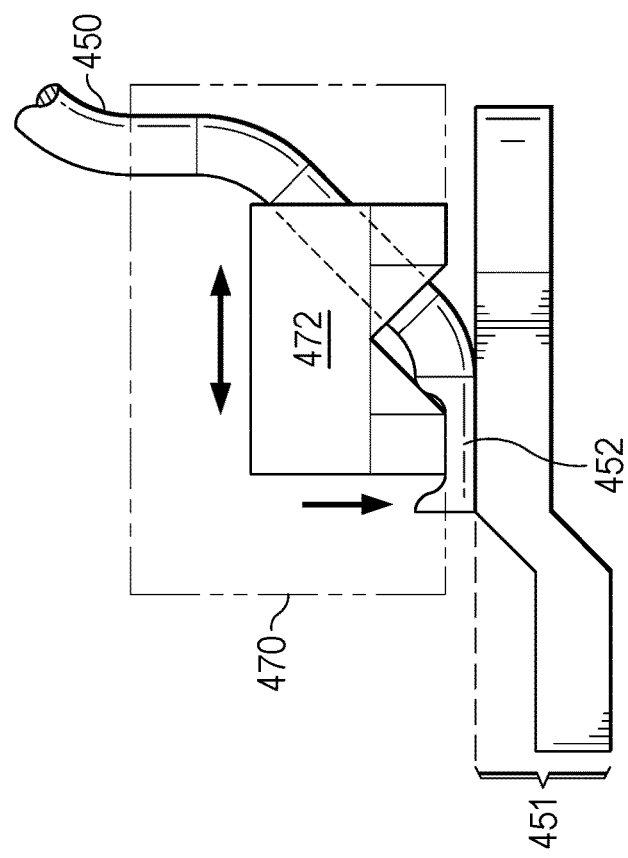
FIG. 4 illustrates, in a block diagram, the operation of a wedge bonding tool that is useful in an arrangement.

FIG. 4 illustrates, in a block diagram, the operation of a wedge bonding tool 470 to form a wedge bond 452 that is useful with the arrangements. A bond wire wedge 472 has an aluminum or copper wire 450 extending through an opening. To form a wedge bond on a conductive lead of a package substrate 451, the bond wire wedge 472 applies mechanical pressure against the aluminum or copper wire 450 and presses it against the package substrate to form a wedge bond 452, the bond wire wedge 472 can also vibrate due to the application of ultrasonic energy, to increase the bond strength. An advantage of the arrangements is that the aluminum or copper wedge bonding is a room temperature process, so that no additional heat stress is applied to the semiconductor die already mounted to the package substrate, increasing reliability and preventing problems that might occur if additional thermal processing were performed. The wire is low in cost and well known in semiconductor processing and packaging. The wedge bonding can be done at temperatures less than 30 degrees Celsius, for example. In addition, in contrast to ball bonding, when copper or aluminum wedge bonding is performed at room temperature on a copper surface of a leadframe or other package substrate, no additional plating such as silver or nickel, palladium, gold plating at the wedge bond site are needed for a reliable wedge bond.

FIGS. 5A-5G illustrate, in a series of steps, a process for forming an example arrangement.

Figure 5A:
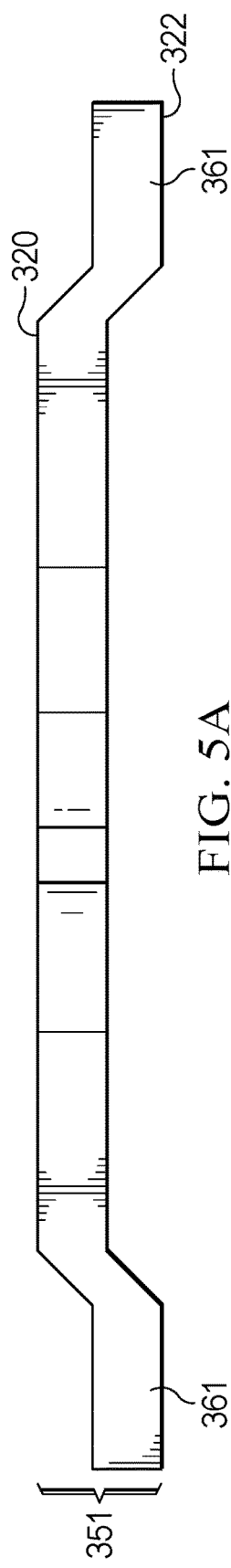

In FIG. 5A, a package substrate 351 is shown. In the illustrated example the package substrate 351 is a chip on lead leadframe. Leads 361 extend from exterior ends to a central portion, and interior ends of the leads are configured to receive a flip chip mounted semiconductor die. The package substrate 351 has a device side surface 320 and a board side surface 322 opposite the device side surface. Leads 361 may have the exterior ends may be pre-tinned to prepare them for solder in a surface mount technology process. Alternatively, the ends of the leads that form terminals may be tinned after molding to prepare the leads 361 for solder in a surface mount technology (SMT) process.

FIG. 5B illustrates in another end view a flip chip semiconductor die mounting step. Semiconductor die 302 is oriented with conductive post connects 314 and solder bumps 316 facing the device side surface 320 of the package substrate 351. The semiconductor die 302 is positioned and ready to be placed directly on the leads 361 in a chip on lead die mounting process. A solder reflow process then forms solder joints between the solder bumps 316 and the conductive leads 361 of the package substrate 351.

FIG. 5C illustrates in another end view the package substrate 351 after the semiconductor die 302 is mounted using a solder reflow step to melt solder balls 316 to form solder joints to the package substrate. The mounted semiconductor die has a thickness "T" which can vary from 100 microns to 300 microns depending on the process used to fabricate the semiconductor die.

Figure 5D:
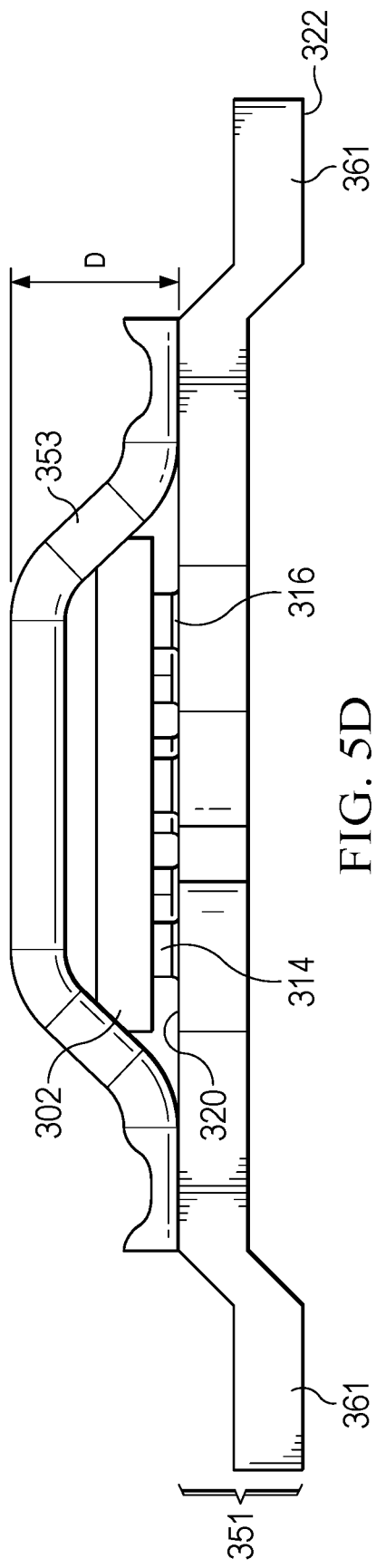

FIG. 5D illustrates in another end view the package substrate 351 and the semiconductor die 302 after a bracket 353 is formed and mounted to the device side surface 320 package substrate 351. In an example process a wedge bonding tool (see FIG. 4) is used to attach aluminum or copper wire to one side of the package substrate 351 using a first wedge bond, and to form the bracket 353 extending to a distance "D" that is greater than the thickness T of the semiconductor die 302. The bracket 353 is formed having a horizontal top surface, and then extending downwards to a second wedge bond on the other side of the package substrate. In examples, distance D can be 400 microns to 1000 microns with a total semiconductor device package thickness of about 600 microns to 1200 microns. The bracket 353 can be attached to conductive leads 361 on the package substrate 351 and the semiconductor die 302 can be coupled to the bracket 353 by the conductive leads. While only one bracket 353 is shown in FIG. 5D, which is an end view, another bracket can also be formed to provide a mount for each of two terminals of the passive device. As described above, aluminum or copper wire can be used to form brackets 353, with aluminum wire being a lower cost arrangement.

Figure 5E:
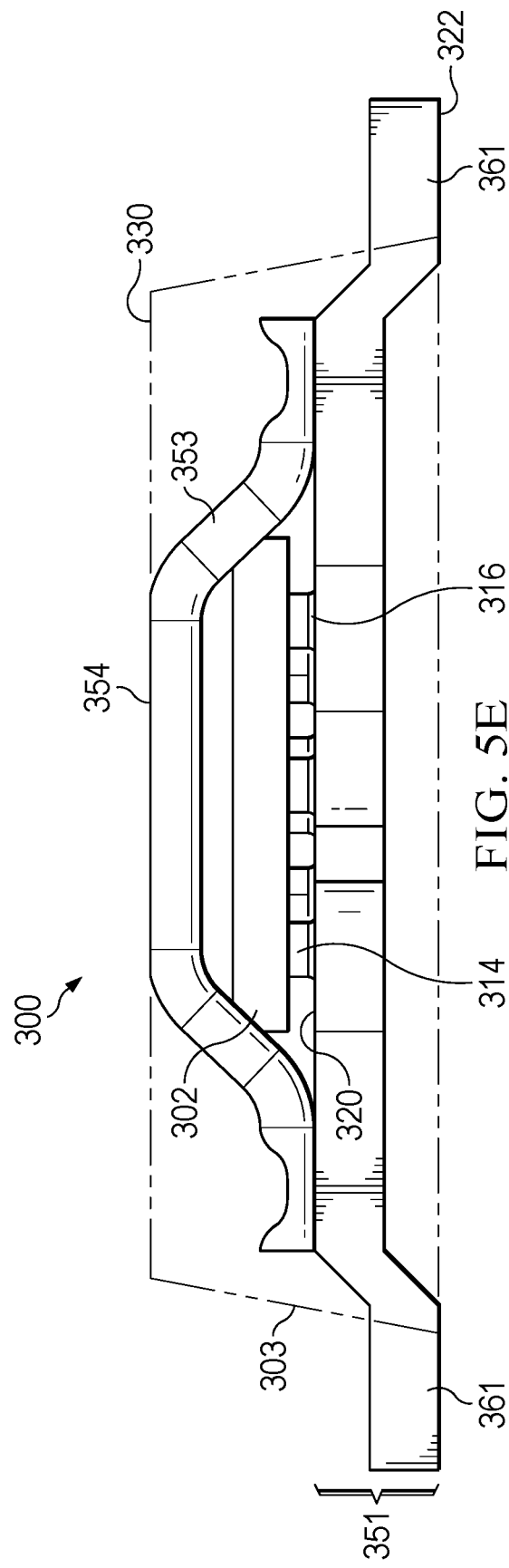

FIG. 5E illustrates, in a further end view, the semiconductor die 302 and the package substrate 351 of FIG. 5D, after additional processing. In FIG. 5E, a complete semiconductor device package 300 is shown, with mold compound 303 covering the semiconductor die 302, portions of the package substrate 351, and portions of the bracket 353. Mount 354 on a top surface 330 of the semiconductor device package 300 is formed by exposing portions of the bracket 353 from the mold compound 303. By forming mounts on the top surface 330 of the semiconductor device package 300 for a passive device, a vertically stacked system is possible, allowing for the combination of the semiconductor die 302 and a passive component together in a single device, reducing the board area needed for a system. The semiconductor device package 300 shown in FIG. 5E can be a finished device delivered for later assembly with a passive component. Alternatively, the passive component and the semiconductor device package 300 can be combined at the manufacturer site and delivered as a complete system as is described below.

Figure 5F:
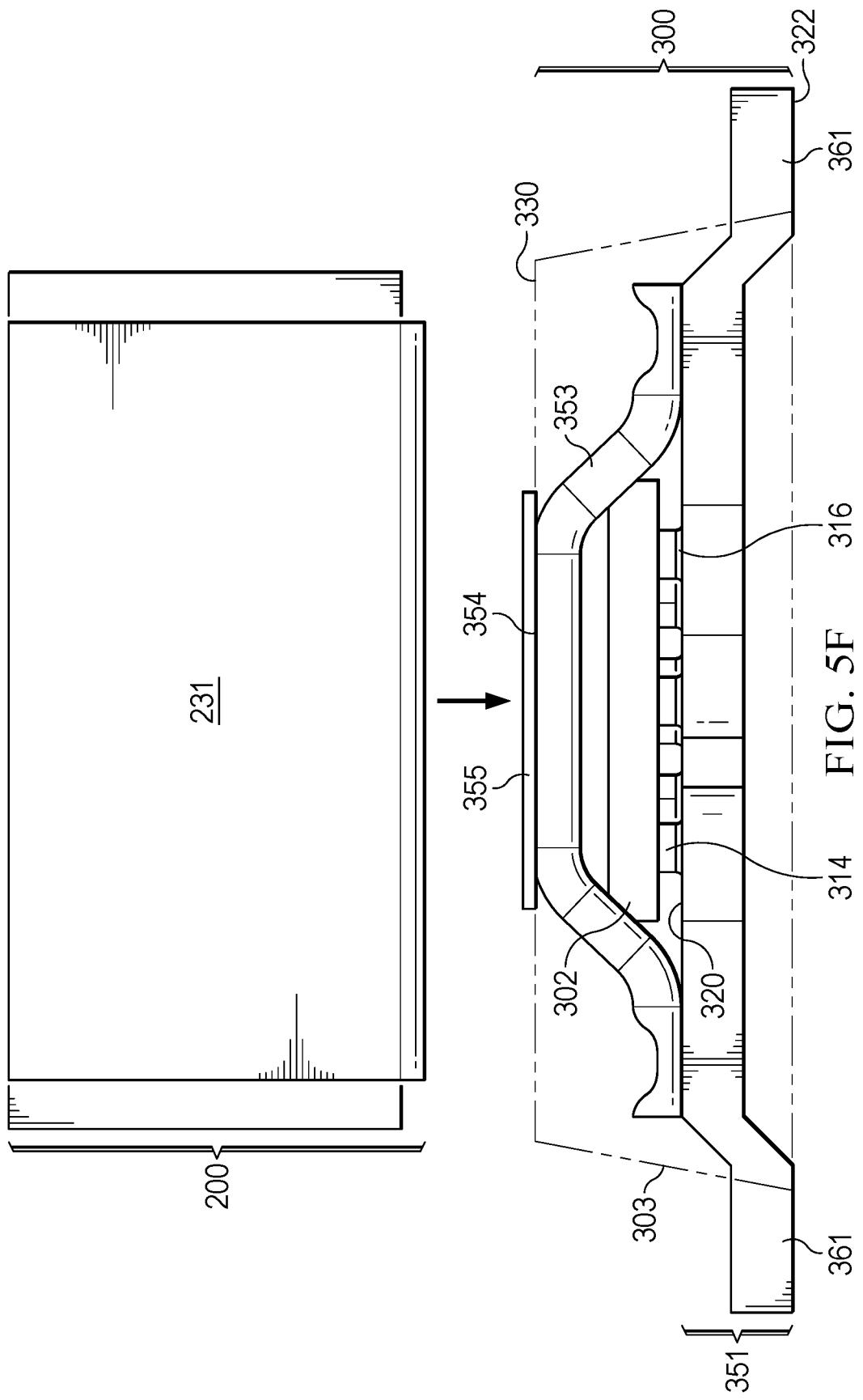

FIG. 5F illustrates the semiconductor device package 300 of FIG. 5E in another side view, with a passive component 200 shown positioned above the semiconductor device package 300 and being positioned for mounting. Solder 355 is shown formed on mount 354 of the semiconductor device package 300, so that a passive component terminal 231 can be attached to and electrically coupled to bracket 353 by a soldering process. When aluminum wire is used to form the bracket 353, a solder formulated for aluminum wire soldering is used. A solder specifically formulated for aluminum that contains zinc and tin is commercially available from SMIC in Tokyo, Japan as described above and can be used to solder the passive component 200 to the mount 354. When copper wire is used to form the bracket 353, the solder can be any type used in circuit assembly with copper wire or copper traces.

Figure 5G:
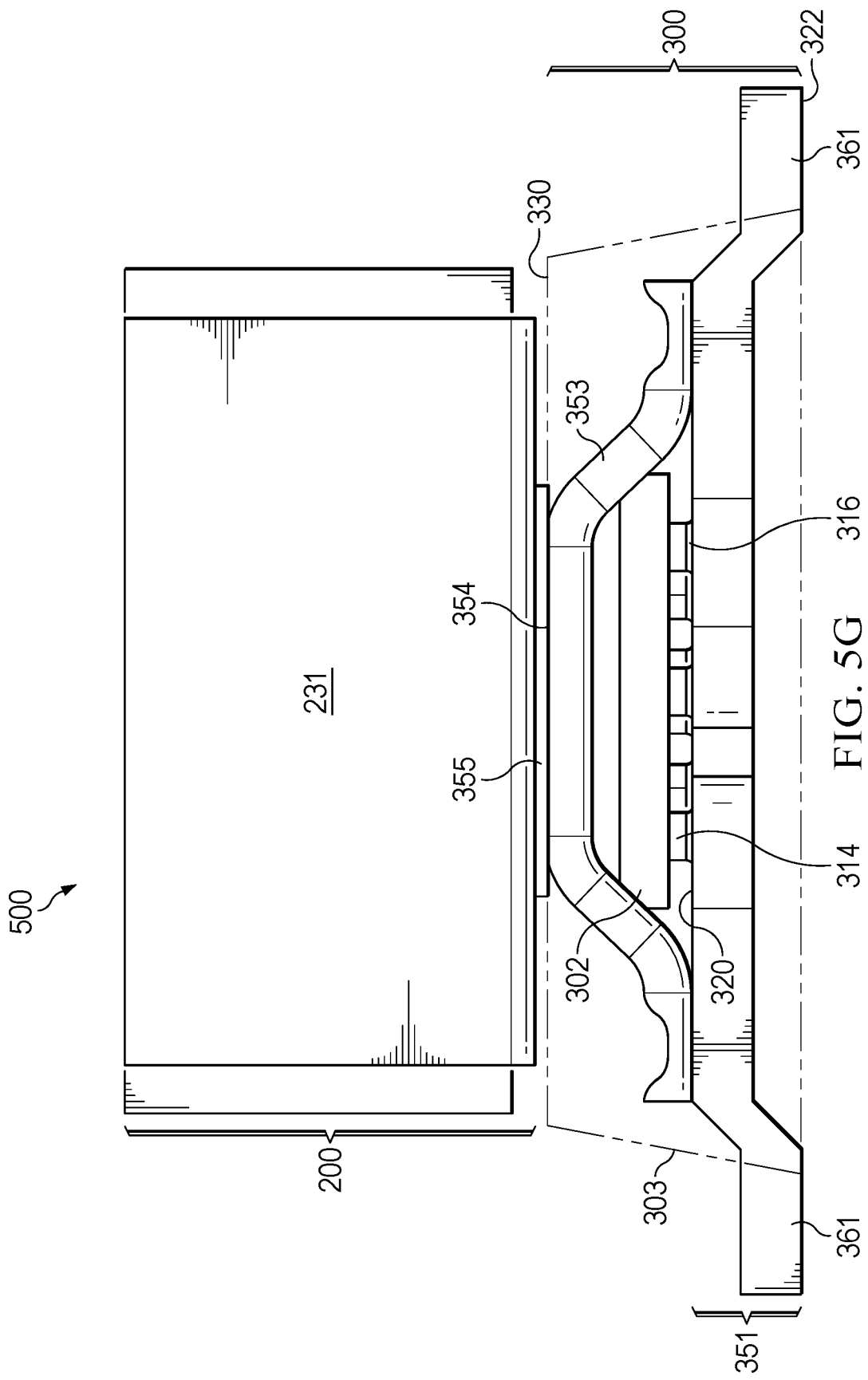

FIG. 5G illustrates a system 500 formed by the semiconductor device package 300 and the passive component 200 shown in FIG. 5F after a solder process is used to solder the passive component 200 to the top surface 330 of the semiconductor device package 300 using solder 355 and mounts 354 to form a solder joint. The two components form a vertically stacked system 500. The two components (200 and 300) are mechanically attached and are electrically coupled together. The passive component 200 can be, for example, an inductor or coil for a switching power semiconductor device. Other components such as capacitors, resistors, diodes, transducers, or other sensors can be mounted to the semiconductor device package using the arrangements. Because the semiconductor device package 300 is a complete packaged device, and the passive component 200 is also a complete packaged device, the mounting of the passive component 200 can be done at a time and place that is independent from the manufacture of the semiconductor device package 300. Alternatively, the stacked system 500 can be formed contemporaneously with the manufacture of the semiconductor device package 300 and delivered as a combined unit for system mounting.

Use of the brackets formed from aluminum wire or copper wire with a wedge bonding tool in the arrangements provides a cost effective, reliable and robust solution to combining a passive component with a semiconductor die, with reduced board area (when compared to side by side module arrangements or to mounting discrete components) and with reduced costs (when compared to a solution using copper posts, rails or clips formed and then attached to a package substrate). The room temperature wedge bonding process used to form the brackets in the arrangements further reduces thermal stress on the semiconductor die and the solder joints used to mount the semiconductor die to the package substrate (when compared to other prior approaches formed without use of the arrangements).

FIGS. 6A-6F illustrate, in another series of end views, selected steps for forming an alternative arrangement. In FIGS. 6A-6F, the example semiconductor device package shown is formed with a face up, wire bonded semiconductor die in a "no-lead" package such as a small outline no-lead (SON) package. Wire bonded and face up mounting for the semiconductor die can be provided in leaded and no-lead packages of various types that can form additional arrangements.

Figure 6A:
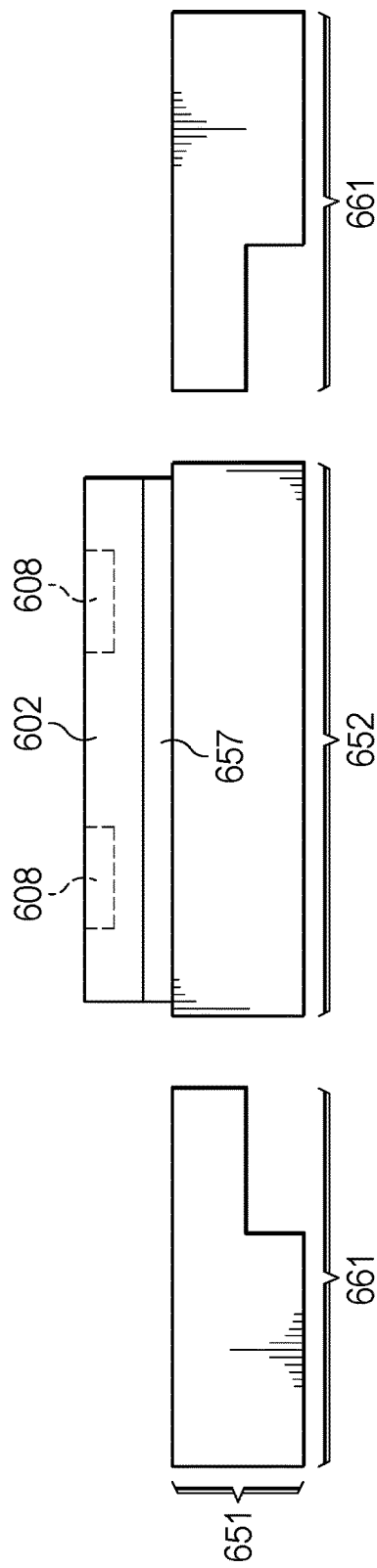

In FIG. 6A, a package substrate 651 is shown in an end view with a semiconductor die 602, which is similar to semiconductor die 102 in FIG. 1B, for example, mounted to a die pad 652 that is spaced from leads 661. The die pad 652 is arranged for mounting a semiconductor die. The leads 661 are arranged for a no-leads package that can be surface mounted, and in the example the leads have full thickness exterior ends and have a partial thickness (less than the full thickness) at interior ends that are spaced from the die pad. Because the interior ends of the leads 661 are of less thickness than the exterior ends, the leads 661 can be referred to as "cantilever" leads. Die attach material 657 is used to mount a backside surface of the semiconductor die 602 to the die pad 652. In an example a thermally conductive die attach epoxy is dispensed by a needle dispenser, drop on demand dispenser, inkjet nozzle, or by use of a stencil. In an alternative process, die attach material 657 can be a tape or film. Depending on the application, die attach material 657 can be electrically insulating or electrically conductive. Suitable die attach adhesive materials are commercially available from Henkel Corporation in Rocky Hill Connecticut, USA, and other locations.

Figure 6B:
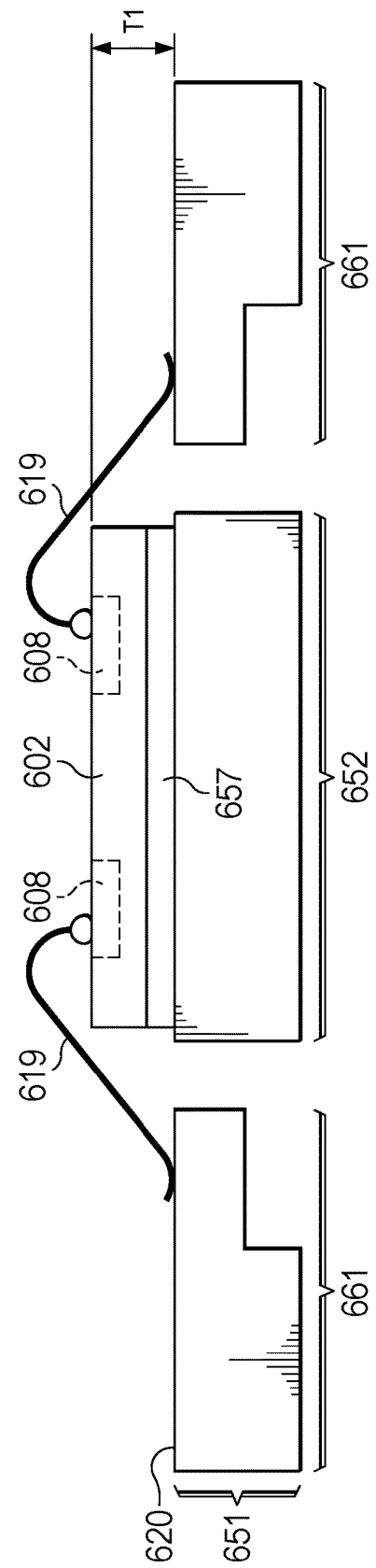

FIG. 6B illustrates in another end view the package substrate 651 and the semiconductor die 602 of FIG. 6A after additional processing. In FIG. 6B, wire bonds 619 are shown formed between bond pads 608 on the semiconductor die 602 and on the device side surface 620 of conductive leads 661 of the package substrate 651. The package substrate 651 can be a partially etched copper leadframe, for example, and can be plated or spot plated to improve bondability. Silver, nickel, gold, palladium or combinations of plated layers can be used. The package substrate 651 can be a molded interconnect substrate (MIS), a partially molded leadframe (PMLF), or as shown, a metal leadframe. The metal leadframe can be of copper, copper alloys, Alloy 42, stainless steel or steel. The semiconductor die 602 and the wire bonds 619 have a thickness labeled "T1" above a device side surface 620 of the package substrate 651. The thickness T1 in useful examples is between 100 and 300 microns.

In an example wire bonding process useful in forming the wire bonds 619, gold, silver, copper or palladium coated copper (PCC) bond wire extends through an opening in a capillary of a wire bonding tool. A ball is formed at the exposed end of the bond wire by a flame or electric spark. The molten ball is mechanically bonded to a bond pad of the semiconductor die by a combination of mechanical compression, heat, and sometimes ultrasonic energy to form a ball bond. As the capillary moves away from the ball bond on the bond pad, the bond wire is allowed to extend from the ball bond and forms an arc or curved shape above the package substrate. The capillary then moves the bond wire above a conductive lead and the bond wire is compressed against the conductive lead to form a stitch bond. As the capillary moves away from the stitch bond the bond wire is cut by the tool to leave a short tail on the stitch bond, and the wire bonding process begins again by forming a ball on the end of the bond wire. By advanced automation, a wire bonder can form many wire bond connections per second.

Figure 6C:
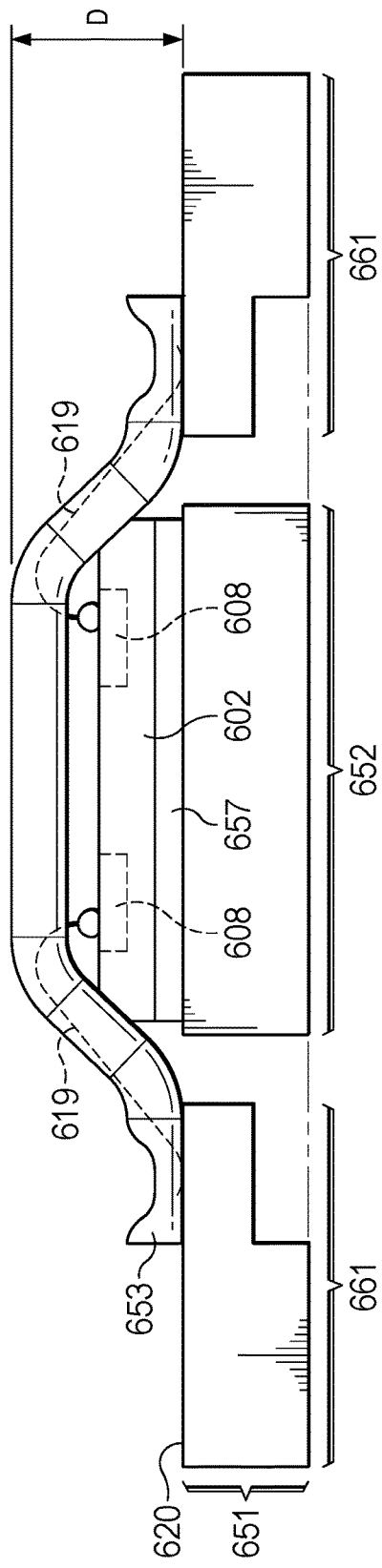

FIG. 6C illustrates, in another end view, the semiconductor die 602 and package substrate 651 with bracket 653 formed on the device side surface 620 of the package substrate 651. In an example process, the bracket 653 is formed from aluminum wire having a diameter between 100 and 500 microns, and is attached to conductive leads 661 of the package substrate 651 by wedge bonding. In an alternative arrangement, the bracket 653 can be formed using copper wire with similar diameter, 100 to 500 microns, and wedge bonded to the package substrate. After a first wedge bond is formed, a wedge tool forms the bracket 653 to extend to a horizontal top surface at a distance "D" from the package substrate 651 that is greater than the thickness T1 (see FIG. 6B) of the semiconductor die 602 and wire bonds 619. In example arrangements, distance D can be from 400 microns to 1000 microns. A second wedge bond formed in the aluminum or copper wire at the other side of the package substrate completes the bracket 653. The bracket 653 will provide a mount for attaching a passive component to the completed semiconductor device package, and is arranged to electrically couple the passive component to the leads of the package substrate, which can also be used to electrically couple the passive component to the semiconductor die 602, to form a system. Although the end view in FIG. 6C shows only one bracket 653, at least two brackets are formed to provide mounts for at least two terminals of the passive component. Additional brackets 653 can be formed to mount additional passives, or for a passive with more than two terminal, as is further described below.

Figure 6D:
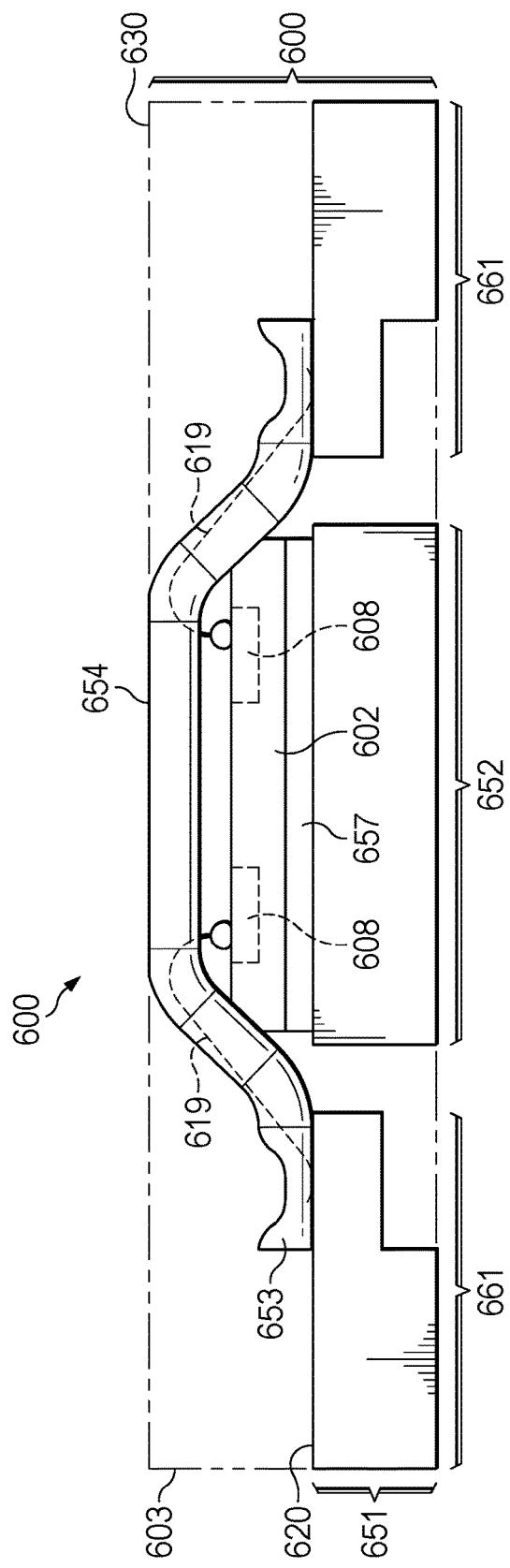

FIG. 6D illustrates, in another end view, the semiconductor die 602, package substrate 651 and bracket 653 after a molding process. Mold compound 603 is formed covering the semiconductor die 602, portions of the package substrate 651 and the conductive leads 661, and portions of the bracket 653. A top surface of the bracket 653 is exposed from the mold compound 603 to form a mount 654. In an example process, a thermoset mold compound that is solid at room temperature is heated to a liquid state. The package substrate 651, including the semiconductor die 602 and the bracket 653 are placed in a mold tool. The liquid mold compound is forced by a mechanical ram to cause the mold compound to flow through runners into the mold and to cover the devices, The thermoset mold compound is allowed to cool and form a solid package body that protects the semiconductor die 602 and the bond wires 619, and portions of the leads 661 form terminals on the board side surface of the semiconductor device package 600. The mount 654 provides an exposed surface of the bracket 653 that can be used to mount a passive component on the top surface of the semiconductor device package 600. The thermoset mold compound can be an epoxy mold compound (EMC). Other epoxies, resins, and plastics can be used to form alternative arrangements.

FIG. 6E illustrates, in another end view, the semiconductor device package 600 of FIG. 6D with a solder 655 formed on the mount 654 on a top surface 630 of the semiconductor device package 600, with passive component 200 positioned for mounting to the semiconductor device package 600. When the bracket 653 is formed of aluminum wire, a solder composition that is formulated for aluminum such as the mount can be used. In an example process a solder containing zinc and tin formulated for aluminum wire is used. A solder useful with the arrangements is commercially available from SMIC of Tokyo Japan and labeled as "AL200" or "ALS Series Lead Free Cored Solder" as described above. In an alternative, the bracket 653 can be of copper wire, and any solder used in circuit assembly with copper wire or copper traces can be used.

Figure 6F:
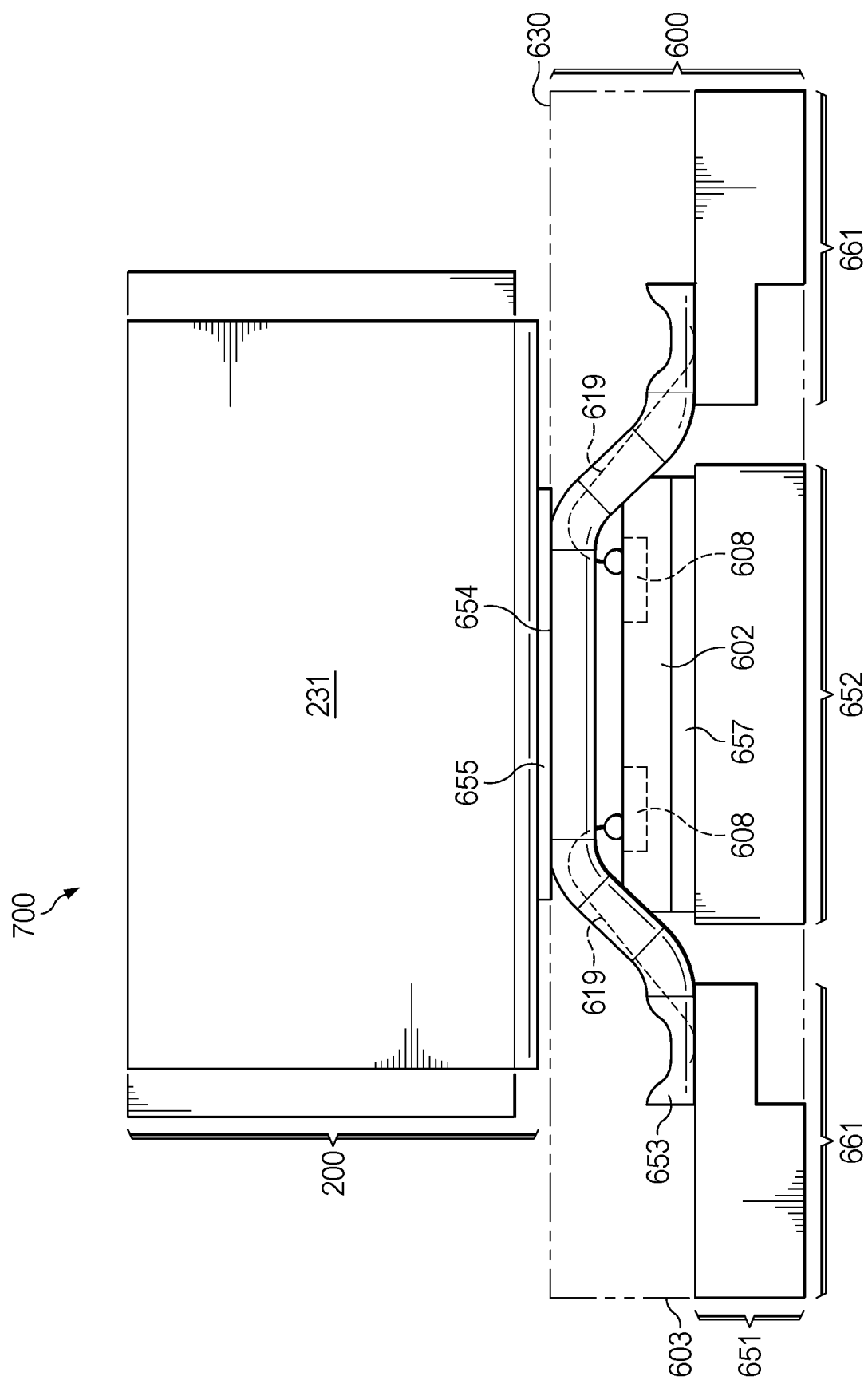

FIG. 6F illustrates in an end view the semiconductor device package 600 and passive component 200 of FIG. 6E after a mounting step forms a vertically stacked system. The passive component 200, which can be an inductor or coil as in the illustrated examples, is solder mounted to the semiconductor device package 600 on a top surface 630 to form a combination 700. Because the passive component 200 is mounted to and coupled to the semiconductor device package 600 on top surface 630, no board area is needed to include the passive component with the semiconductor device package, increasing integration. Because the passive component 200 has connections made on the top surface of the semiconductor device package 600 in the combined unit 700, the assembly process for a module or board is simplified, and the number of connections needed on a system board is reduced by use of the arrangements.

Figure 7A:
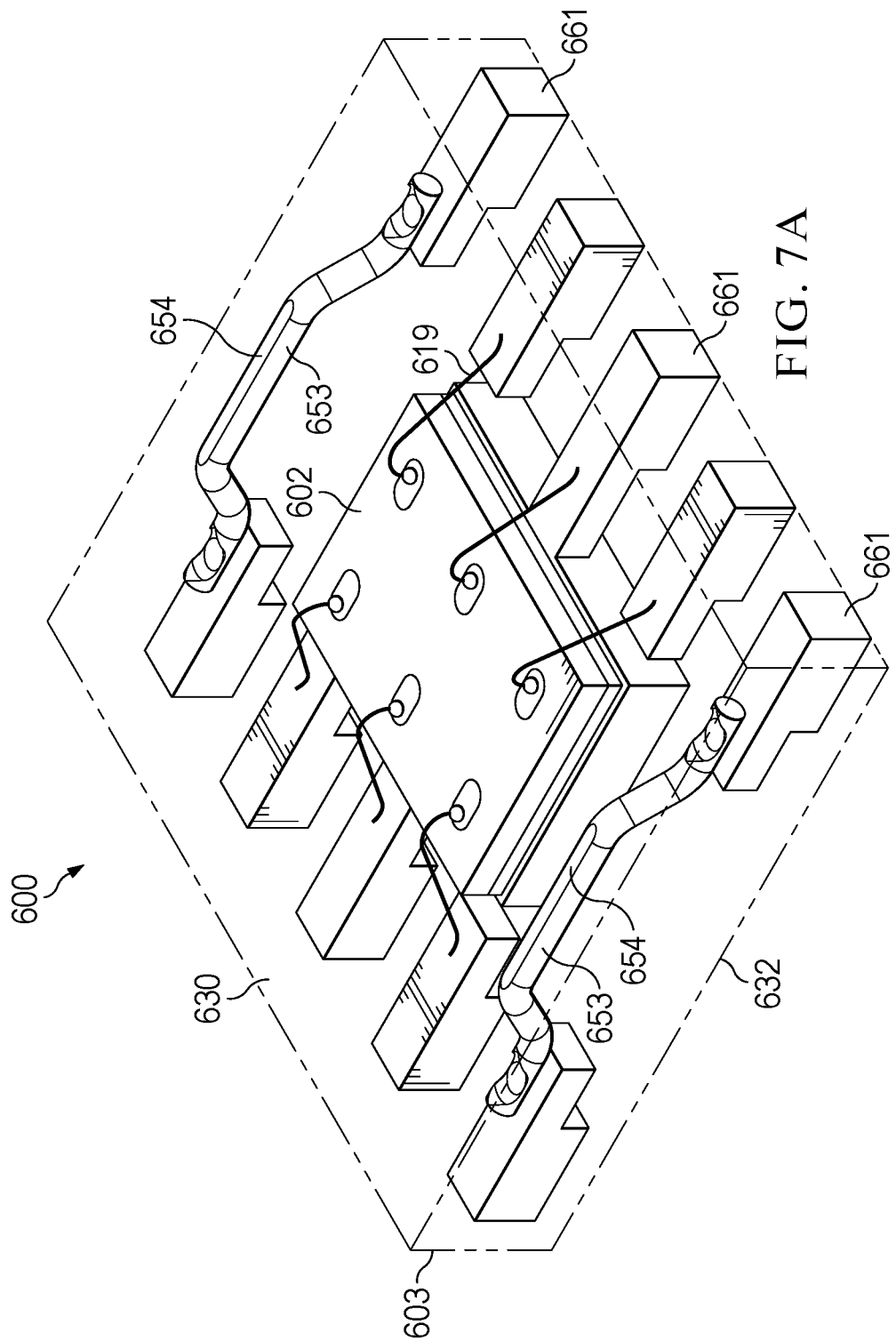
FIGS. 7A-7B illustrate in projection views an example semiconductor device package of an arrangement, and a system including a passive component mounted to a semiconductor package of an arrangement, respectively.
Figure 7B:
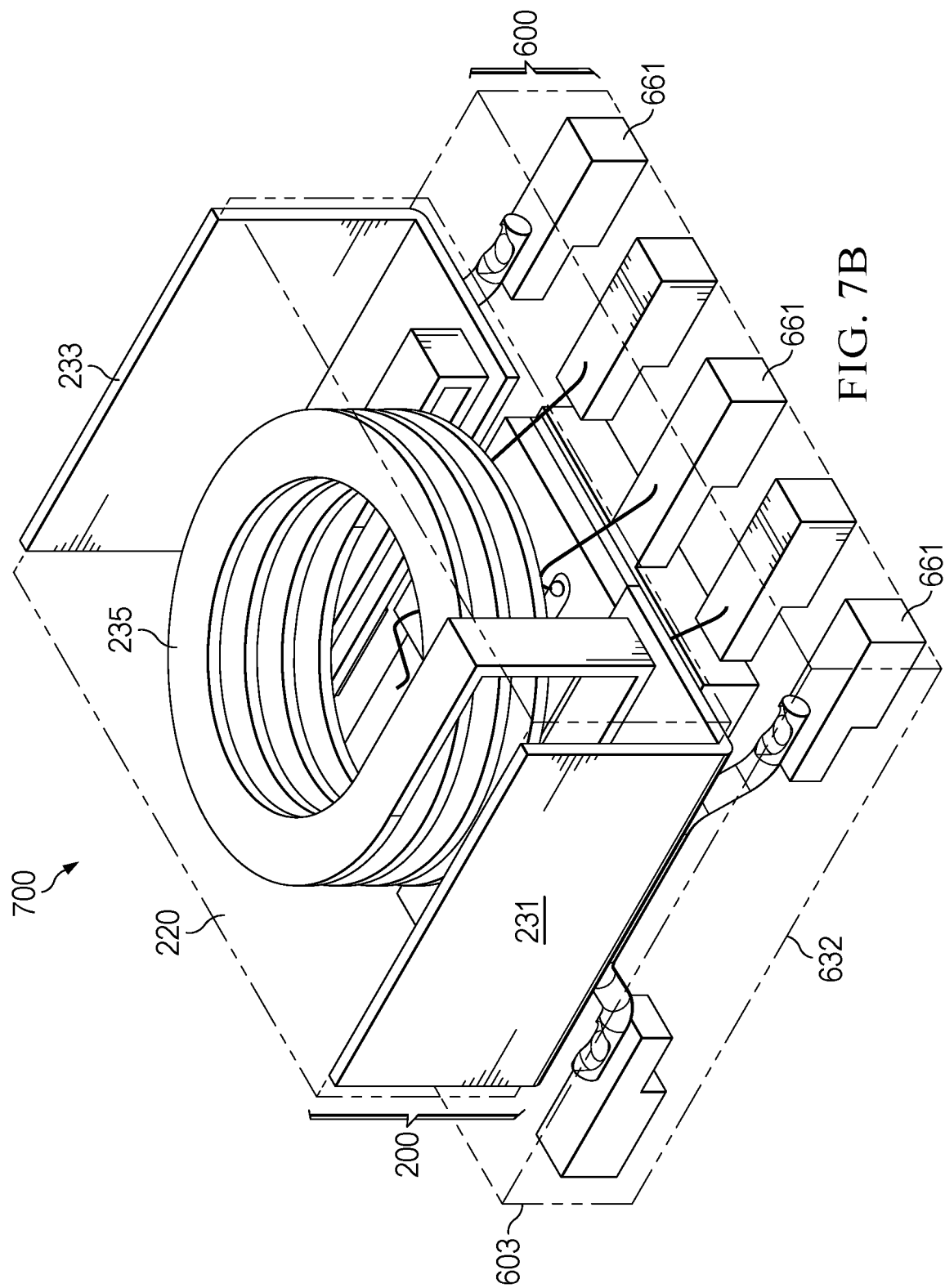

FIGS. 7A-7B illustrate in two projection views the wire bonded arrangement for a semiconductor device package 600, and a system 700 including the passive component 200 and the semiconductor device package 600 combined together, respectively.

In FIG. 7A, the semiconductor device package 600 is shown with mounts 654 on a top surface 630 arranged for mounting a passive component on the top surface. The brackets 653 have a top surface exposed from the mold compound 603 to form the mounts 654. Semiconductor die 602 is shown mounted on the package substrate 651 and wire bonds 619 couple the semiconductor die 602 to the leads 661 of the package substrate 651. A portion of the leads 661 is exposed from the mold compound 603 to form terminals on the sides and board side surface 632 of the semiconductor device package 600 for surface mounting to a system board.

In FIG. 7B a system 700 is shown with semiconductor device package 600 and passive component 200 in a vertically stacked system. The passive component 200 is coupled to the semiconductor device package 600 by solder connecting the terminals 231, 233 to the semiconductor device package 600. The inductor 235 is coupled to the semiconductor die within the semiconductor device package 600 through the mounts and the brackets as described above. A passive component housing or package 220 protects the inductor 235.

Figure 8A:
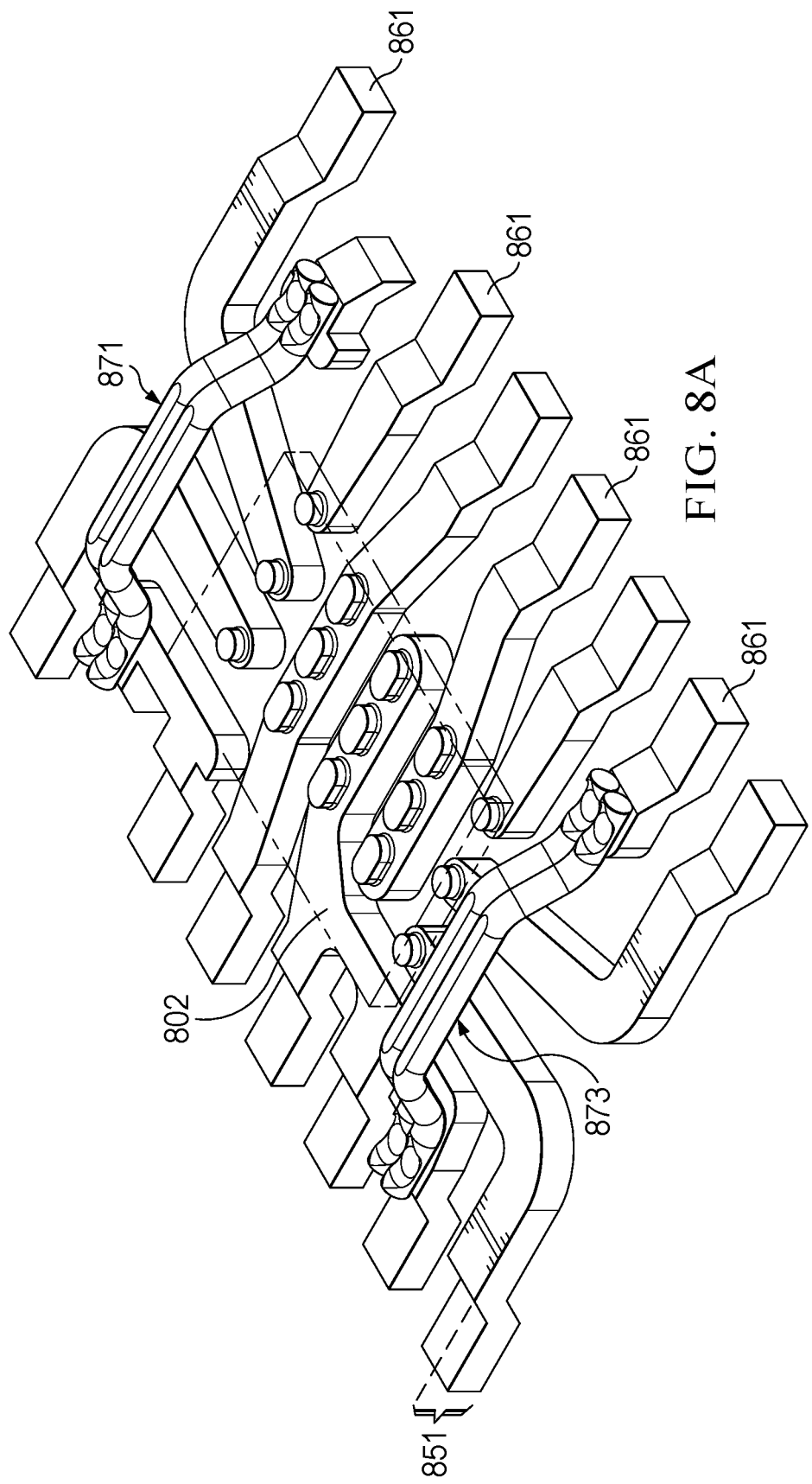
FIGS. 8A-8B illustrate, in projection views, features of two alternative arrangements.
Figure 8B:
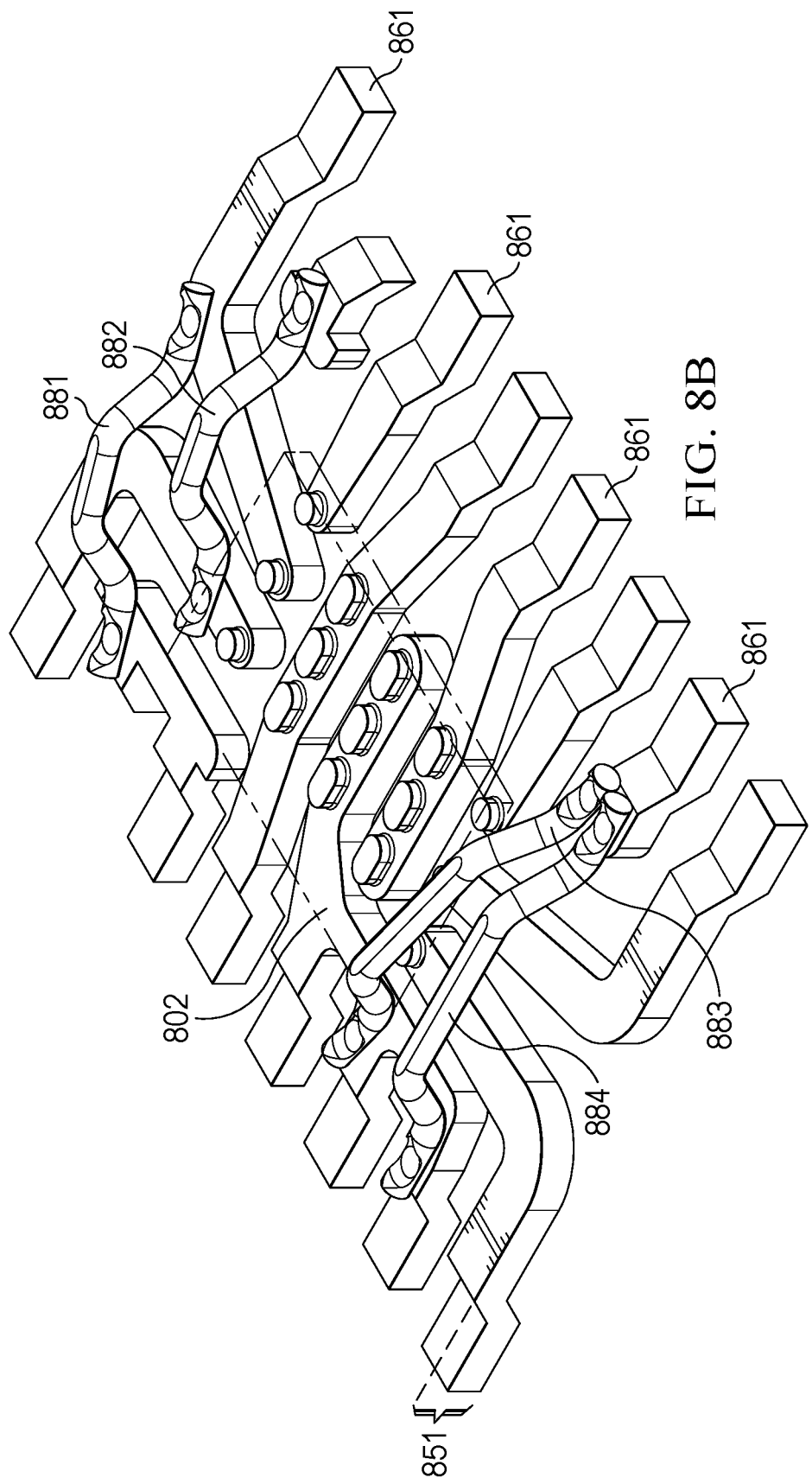

FIGS. 8A-8B illustrate, in two projection views, two alternative arrangements that can be formed using the brackets of aluminum or copper attached to a package substrate. In FIG. 8A, the package substrate 851 is a chip on lead (COL) package leadframe similar to package substrate 351 described above (see FIG. 3A) with a semiconductor die 802 flip chip mounted to the leads 861. Two pairs of aluminum or copper brackets 871, 873 each have two brackets that are coupled in parallel to the package substrate 851. By using pairs of brackets that are formed of aluminum or copper wire coupled in parallel, the resistance of the connections made between a passive component to be mounted to the brackets and the package substrate can be reduced. Additional brackets can be used to further reduce the resistance of the connections.

In FIG. 8B, in an additional alternative arrangement, the package substrate 851 is shown with four aluminum or copper brackets 881, 882, 883, 884 making different connections to the package substrate 851. The arrangements provide the capability to make flexible connections from the package substrate 851 to components that will be mounted on a top surface of a semiconductor device package. In an example system using this illustrated arrangement, an inductor, resistor, and capacitor can be stacked vertically on a semiconductor device package and coupled to a transistor or driver circuit in a semiconductor die to form a commonly needed "RLC" function at an output or input.

The aluminum or copper brackets of the arrangements can be configured to provide a variety of circuit functions in combination with a semiconductor die, without the need to modify the semiconductor die, the package substrate, or the molding process. These various arrangements can be made using existing semiconductor die designs so the use of the arrangements is easily adopted. The costs for aluminum or copper wire and the wedge bonding used in the arrangements are relatively low, and so the solutions achieved by use of the arrangements are cost effective.

Figure 9:
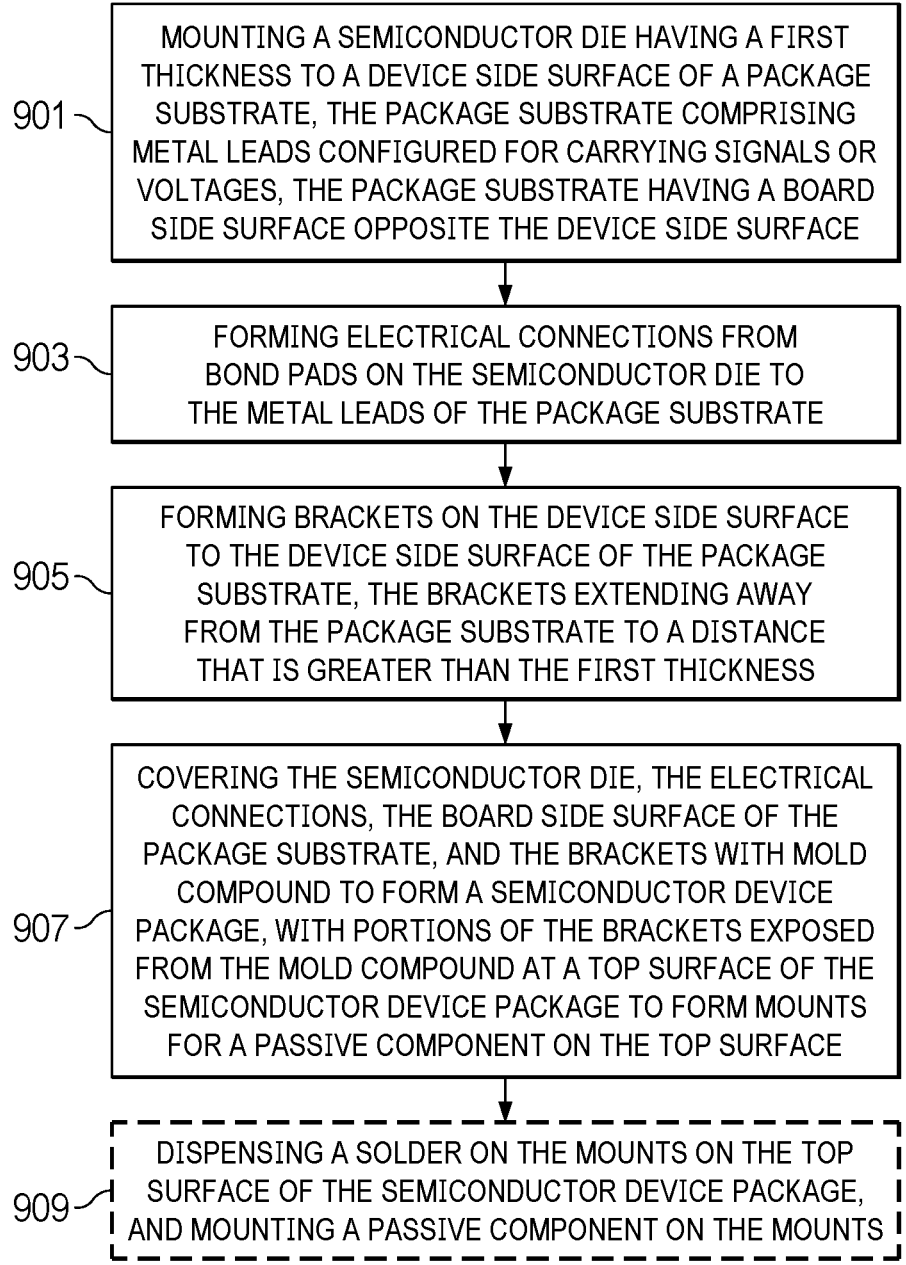
FIG. 9 illustrates, in a flow diagram, a method for forming a semiconductor device package of the arrangements.

FIG. 9 illustrates, in a flow diagram, steps for forming an arrangement corresponding to the steps shown in the series of illustrations At step 901, a semiconductor die having a first thickness is mounted to a device side surface of a package substrate, the package substrate including metal leads configured for carrying signals or voltages. The package substrate has a board side surface opposite the device side surface. (See, for example, semiconductor die 302 and package substrate 351 in FIGS. 5B and 5C).

At step 903, electrical connections are formed from bond pads on the semiconductor die to the metal leads of the package substrate (see FIG. 5C, where semiconductor die 302 flip chip mounted, and semiconductor die 602 with wire bonds 619 in FIG. 6B).

At step 905, aluminum or copper wire brackets are mounted to the device side surface of the package substrate, the brackets extending away from the package substrate to a distance that is greater than the first thickness of the semiconductor die. (See, for example, bracket 353 on the package substrate 351 in FIG. 5D, and bracket 653 on the package substrate 651 in FIG. 6C).

At step 907, the method continues when the semiconductor die, the electrical connections, the board side surface of the package substrate, and the brackets are covered with mold compound to form a semiconductor device package, with portions of the brackets exposed from the mold compound at a top surface of the semiconductor device package to form mounts for a passive component on the top surface. (See mold compound 603 in FIG. 6D, with mount 654 exposed from the mold compound 603).

After the semiconductor device package with the mounts is formed, passive components can be vertically stacked on the semiconductor device package (see, for example, passive component 200 stacked on semiconductor device package 600 in FIGS. 6F and 7B). At step 909, which is an optional step as indicated by the dashed line surrounding the text, solder is dispensed on the mounts on the top surface of the semiconductor device package. A passive component is then mounted on the top surface of the semiconductor device package using the solder to attach the passive component to the mounts. (See, for example passive component 200 positioned over the solder 655 on mounts 654 in FIG. 6E, and solder mounted to the semiconductor device package 600 in FIG. 6F). Step 909 is shown as optional because this step can be done at a later time, after the semiconductor device package is completed in step 907, alternatively this step can be done immediately after step 907 to form a vertically stacked combination of the passive component and the semiconductor device package as a manufactured unit.

Modifications are possible in the described arrangements, and other alternative arrangements are possible within the scope of the claims.

What is claimed is:

1. An apparatus, comprising:
   a package substrate with conductive leads;
   a semiconductor die mounted to the package substrate, the semiconductor die having a first thickness;
   electrical connections coupling bond pads on the semiconductor die to conductive leads on the package substrate;
   brackets attached to the package substrate spaced from the semiconductor die and extending away from the package substrate to a distance from the package substrate that is greater than the first thickness of the semiconductor die;
   mold compound covering the package substrate, the semiconductor die, the brackets, and the semiconductor die to form a semiconductor device package having a board side surface and a top surface opposite the board side surface, with portions of the conductive leads exposed from the mold compound to form terminals on the board side surface of the semiconductor device package, and with portions of the brackets exposed from the mold compound on a top surface of the semiconductor device package to form mounts for a passive component.

2. The apparatus of claim 1, and further comprising:
   a passive component mounted to the mounts on the top surface of the semiconductor device package.

3. The apparatus of claim 2, wherein the brackets are formed of aluminum wire.

4. The apparatus of claim 3, wherein the passive component is soldered to the mounts on the top surface of the semiconductor device package by a solder that contains zinc and tin.

5. The apparatus of claim 1, wherein the brackets are of aluminum wire or copper wire.

6. The apparatus of claim 1, wherein the passive component is an inductor, a capacitor, a resistor, a coil, a transformer, or a sensor.

7. The apparatus of claim 1, wherein the brackets comprise an aluminum wire of a diameter between 100 microns and 500 microns.

8. The apparatus of claim 7, wherein the aluminum brackets are coupled to conductive leads of the package substrate by aluminum wedge bonds.

9. The apparatus of claim 1, wherein the brackets are coupled to conductive leads of the package substrate by wedge bonds.

10. The apparatus of claim 1, wherein the package substrate is a copper leadframe.

11. The apparatus of claim 10, wherein the package substrate is a chip on lead copper leadframe, and the semiconductor die is flip chip mounted to the chip on lead copper leadframe with the bond pads facing the copper leadframe.

12. The apparatus of claim 1, wherein the package substrate is a metal leadframe including a die pads spaced from the conductive leads.

13. The apparatus of claim 12, wherein the semiconductor die is mounted to the die pad with the bond pads of the semiconductor die facing away from the die pad.

14. The apparatus of claim 13, wherein the electrical connections are wire bonds between the bond pads and conductive leads of the metal leadframe.

15. The apparatus of claim 14, wherein the metal leadframe is a copper leadframe, an Alloy 42 leadframe, a stainless steel leadframe, or a plated copper leadframe.

16. The apparatus claim 14, wherein the wire bonds are of gold, silver, aluminum, copper, or palladium plated copper bond wire.

17. An apparatus, comprising:
- a copper leadframe having a board side surface and a device side surface;
- a semiconductor die mounted to the board side surface of the copper leadframe by flip chip mounting, with electrical connections formed by conductive post connects between bond pads on the semiconductor die and conductive leads of the copper leadframe;
- aluminum brackets mounted to conductive leads of the copper leadframe by aluminum wedge bonding, the aluminum brackets extending away from the device side surface of the copper leadframe to a distance greater than a thickness of the semiconductor die;
- mold compound covering the semiconductor die, the device side surface of the copper leadframe and portions of the aluminum brackets to form a semiconductor device package, with portions of the brackets exposed on a top surface of the semiconductor device package to form mounts; and
- a passive component mounted to the mounts on the top surface of the packaged semiconductor device package with solder, the passive component coupled to the semiconductor die by the brackets and the conductive leads of the copper leadframe.

* * * * *